US012805157B2

(12) United States Patent
Kang et al.

(10) Patent No.: US 12,805,157 B2
(45) Date of Patent: Nov. 17, 2026

(54) DISPLAY DEVICE

(71) Applicant: LG Display Co., Ltd., Seoul (KR)

(72) Inventors: ChounSung Kang, Gimpo-si (KR); Daeyun Kim, Seoul (KR); GeunChang Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 436 days.

(21) Appl. No.: 18/524,370

(22) Filed: Nov. 30, 2023

(65) Prior Publication Data

US 2024/0215395 A1 Jun. 27, 2024

(30) Foreign Application Priority Data

Dec. 27, 2022 (KR) ........................ 10-2022-0185316

(51) Int. Cl.
*H10K 59/80* (2023.01)
*H10K 102/00* (2023.01)

(52) U.S. Cl.
CPC ..... *H10K 59/873* (2023.02); *H10K 2102/311* (2023.02)

(58) Field of Classification Search
CPC ........................................................ H05K 5/00
See application file for complete search history.

(56) References Cited

U.S. PATENT DOCUMENTS

2011/0187980 A1 8/2011 Iwai et al.
2012/0262660 A1* 10/2012 Fujiwara ............... G02F 1/1333 349/158
2020/0093011 A1 3/2020 Lee et al.
2020/0154580 A1* 5/2020 Shin .................. G02F 1/133305
2020/0159288 A1 5/2020 Song et al.
2020/0205301 A1 6/2020 Song
2021/0007230 A1 1/2021 Kang et al.
2021/0029839 A1 1/2021 Kwon et al.
2021/0065590 A1 3/2021 Huang et al.
2021/0066626 A1 3/2021 Park et al.
2021/0174711 A1 6/2021 Cho et al.
2022/0068170 A1 3/2022 Han et al.

FOREIGN PATENT DOCUMENTS

CN 110599904 A 12/2019
CN 110910761 A 3/2020
CN 111192523 A 5/2020
CN 111341202 A 6/2020
CN 111627333 A 9/2020
CN 112185249 A 1/2021
CN 112289179 A 1/2021
CN 112447098 A 3/2021
KR 10-2021-0087323 A 7/2021

* cited by examiner

*Primary Examiner* — Jerry Wu
(74) *Attorney, Agent, or Firm* — Fenwick & West LLP

(57) ABSTRACT

According to an aspect of the present disclosure, a display device includes: a display panel including a plurality of pixels; a first cover on a rear surface of the display panel; a second cover on a rear surface of the first cover, and a roller which is configured to wind or unwind the display panel, the first cover, and the second cover, the second cover including a plurality of variable holes configured to pass through the second cover. Therefore, it is possible to improve the durability of the display device and suppress the degradation of a rolling characteristic.

13 Claims, 18 Drawing Sheets

DISPLAY DEVICE

CROSS-REFERENCE TO RELATED APPLICATIONS

This application claims the benefit of Republic of Korea Patent Application No. 10-2022-0185316 filed on Dec. 27, 2022, which is hereby incorporated by reference in its entirety.

BACKGROUND

Field

The present disclosure relates to a display device, and more particularly, to a rollable display device which has improved durability.

Description of the Related Art

Display devices which are used for a monitor of a computer, a television, or a cellular phone, may include an organic light emitting display (OLED) device which is a self-emitting device, or a liquid crystal display (LCD) device which requires a separate light source.

An applicable range of the display device is diversified to personal digital assistants as well as monitors of computers and televisions. A display device with a large display area and a reduced volume and weight is being studied.

Further, recently, a rollable display device which is manufactured by forming a display unit and a wiring line on a flexible substrate such as plastic to display images even though the display device is rolled is getting attention as a next generation display device.

SUMMARY

An object to be achieved by the present disclosure is to provide a display device which relieves stress which is applied to a display device.

Another object to be achieved by the present disclosure is to provide a display device with improved durability and suppresses the degradation of a rolling characteristic.

Still another object to be achieved by the present disclosure is to provide a display device which improves an appearance quality by minimizing a size of a display device wound to a roller.

Still another object to be achieved by the present disclosure is to provide a display device which applies a sheet type back cover, instead of a back cover to which a plurality of aprons is coupled.

Still another object to be achieved by the present disclosure is to provide a display device which uses a sheet type back cover to form a cable hole by a simple process.

Objects of the present disclosure are not limited to the above-mentioned objects, and other objects, which are not mentioned above, can be clearly understood by those skilled in the art from the following descriptions.

According to an aspect of the present disclosure, a display device includes: a display panel including a plurality of pixels; a first cover on a rear surface of the display panel; a second cover on a rear surface of the first cover; and a roller which is configured to wind or unwind the display panel, the first cover, and the second cover, the second cover includes a plurality of variable holes configured to pass through the second cover.

Other detailed matters of the exemplary embodiments are included in the detailed description and the drawings.

According to the present disclosure, a second cover is disposed on a rear surface of the first cover to improve the durability of the display device.

According to the present disclosure, a variable hole which is contractible and expandable is formed in a second cover to reduce the thickness of the second cover during the winding, thereby suppressing the degradation of the rolling characteristic.

According to the present disclosure, the thickness of the second cover is reduced during the winding so that the thickness of the display device is minimized, and a design advantage is increased.

According to the present disclosure, sheet type first cover, second cover, and third cover are used so that the visible horizontal stripe problem due to the multi-apron structure is solved and the process cost is reduced.

According to the present disclosure, the hot press process is performed with the variant-processed metal plate inserted therein to form a cable hole in the second cover with the simple process and the low cost.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1A:
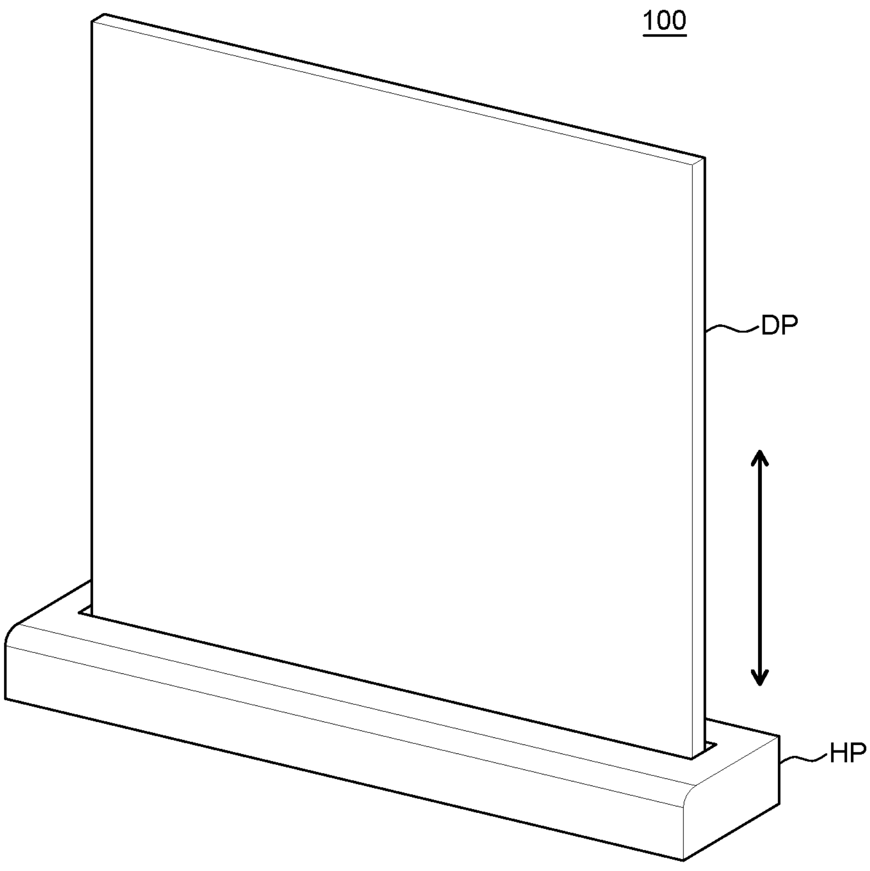
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprise of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

Display Device-rollable Display Device

Figure 1B:
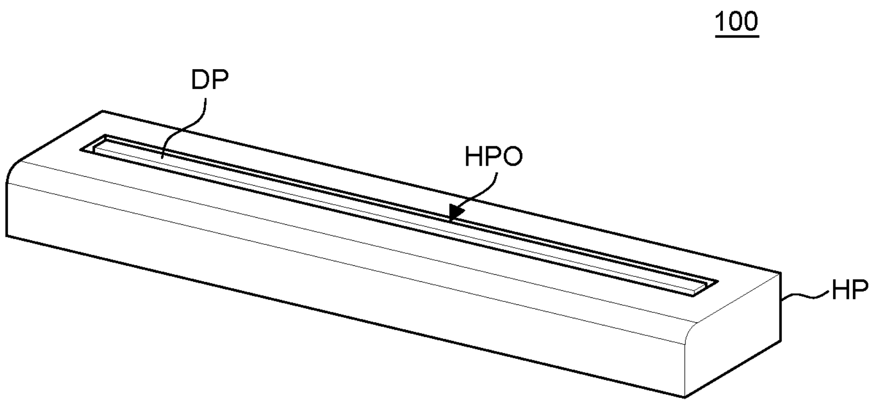

FIGS. 1A and 1B are perspective views of a display device according to an exemplary embodiment of the present disclosure. Referring to FIGS. 1A and 1B, a display device according to an exemplary embodiment of the present disclosure includes a display unit DP and a housing unit HP.

The display unit DP is a configuration for displaying images to a user and for example, in the display unit DP, a display element and a circuit, a wiring line, and a component for driving the display element may be disposed. In this case, since the display device 100 according to the exemplary embodiment of the present disclosure is a rollable display device 100, the display unit DP may be configured to be wound and unwound. For example, the display unit DP may be formed of a display panel 120, a first cover 110*a*, a second cover 110*b*, and a third cover 110*c* each having a flexibility to be wound or unwound. The display unit DP will be described below in more detail with reference to FIGS. 3 to 8B.

The housing unit HP is a case in which the display unit DP is accommodated. The display unit DP may be wound to be accommodated in the housing unit HP and the display unit DP may be unwound to be disposed at the outside of the housing unit HP.

The housing unit HP has an opening HPO through which the display unit DP moves to the inside and the outside of the housing unit HP. The display unit DP may move by passing through the opening HPO of the housing unit HP. As an example, the display unit DP may move in a substantially vertical direction, an inclined direction or even a substantially horizontal direction by passing through the opening HPO of the housing unit HP.

In the meantime, the display unit DP of the display device 100 may be switched from a fully unwound state to a fully wound state or from a fully wound state to a fully unwound state. Embodiments are not limited thereto. As an example, the display unit DP of the display device 100 may be switched from a partially or fully unwound state to a partially or fully wound state or from a partially or fully wound state to a partially or fully unwound state.

FIG. 1A illustrates a fully unwound state of the display unit DP of the display device 100 and the fully unwound display unit DP of the display device 100 is disposed at the outside of the housing unit HP. That is, in order for a user to watch images through the display device 100, when the display unit DP is unwound to be disposed at the outside of the housing unit HP as much as possible and cannot be further unwound any more, it may be defined as a fully unwound state.

FIG. 1B illustrates the display unit DP of the display device 100 which is fully wound and in the fully wound state, the display unit DP of the display device 100 is accommodated in the housing unit HP and cannot be further wound. That is, when the user is not watching the images through the display device 100, it is advantageous from the viewpoint of an outer appearance that the display unit DP is not disposed at the outside of the housing unit HP. Therefore, when the display unit DP is wound to be accommodated in the housing unit HP, it is defined as a fully wound state. Further, when the display unit DP is in a fully wound state to be accommodated in the housing unit HP, a volume of the display device 100 is reduced so that the display device 100 may be easily carried.

In the meantime, in order to switch the display unit DP to a fully unwound state or a fully wound state, a driving unit MP which winds or unwinds the display unit DP is disposed.

Driving Unit

Figure 2:
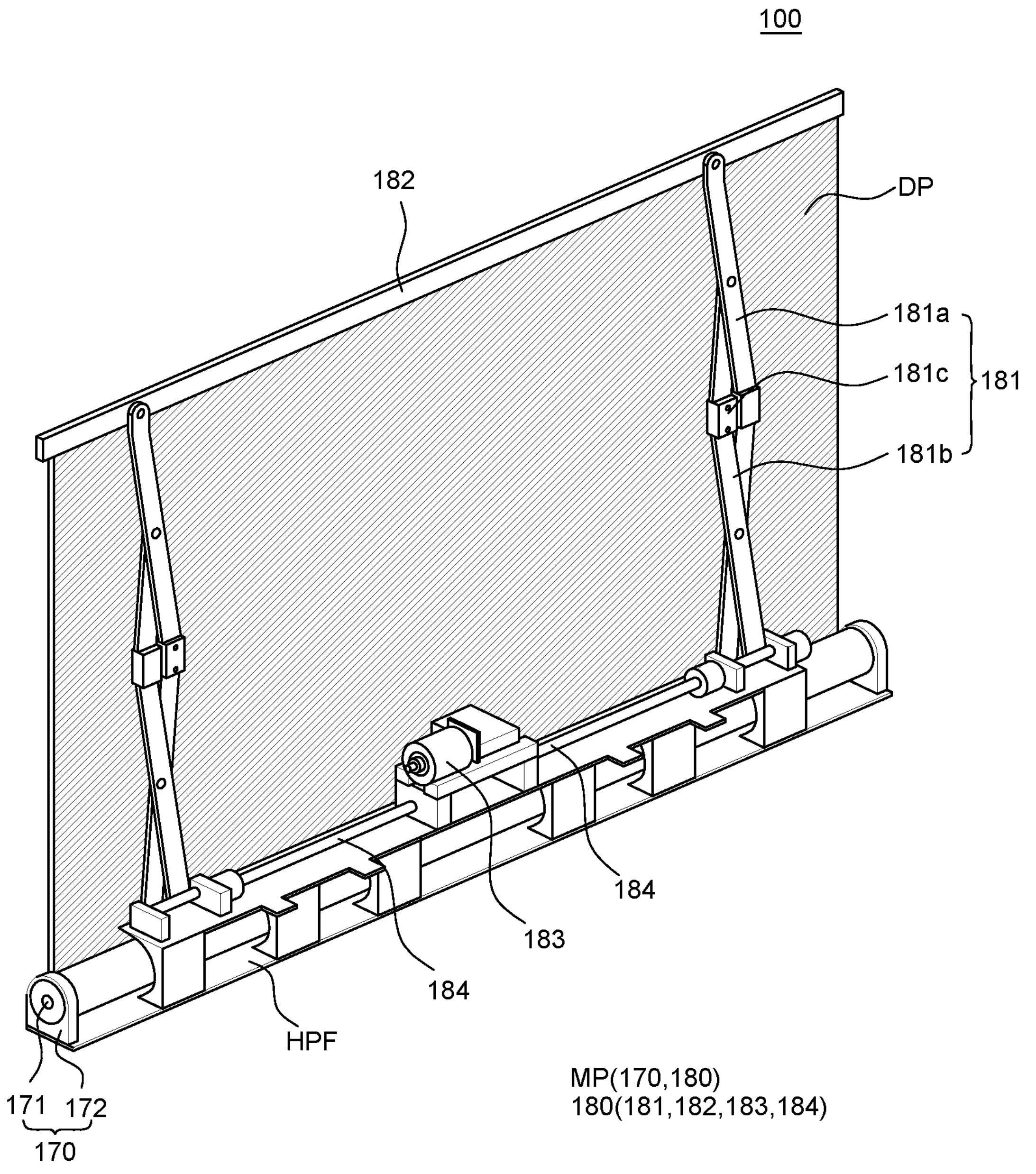
FIG. 2 is a perspective view of a display device according to an exemplary embodiment of the present disclosure.
Figure 3:
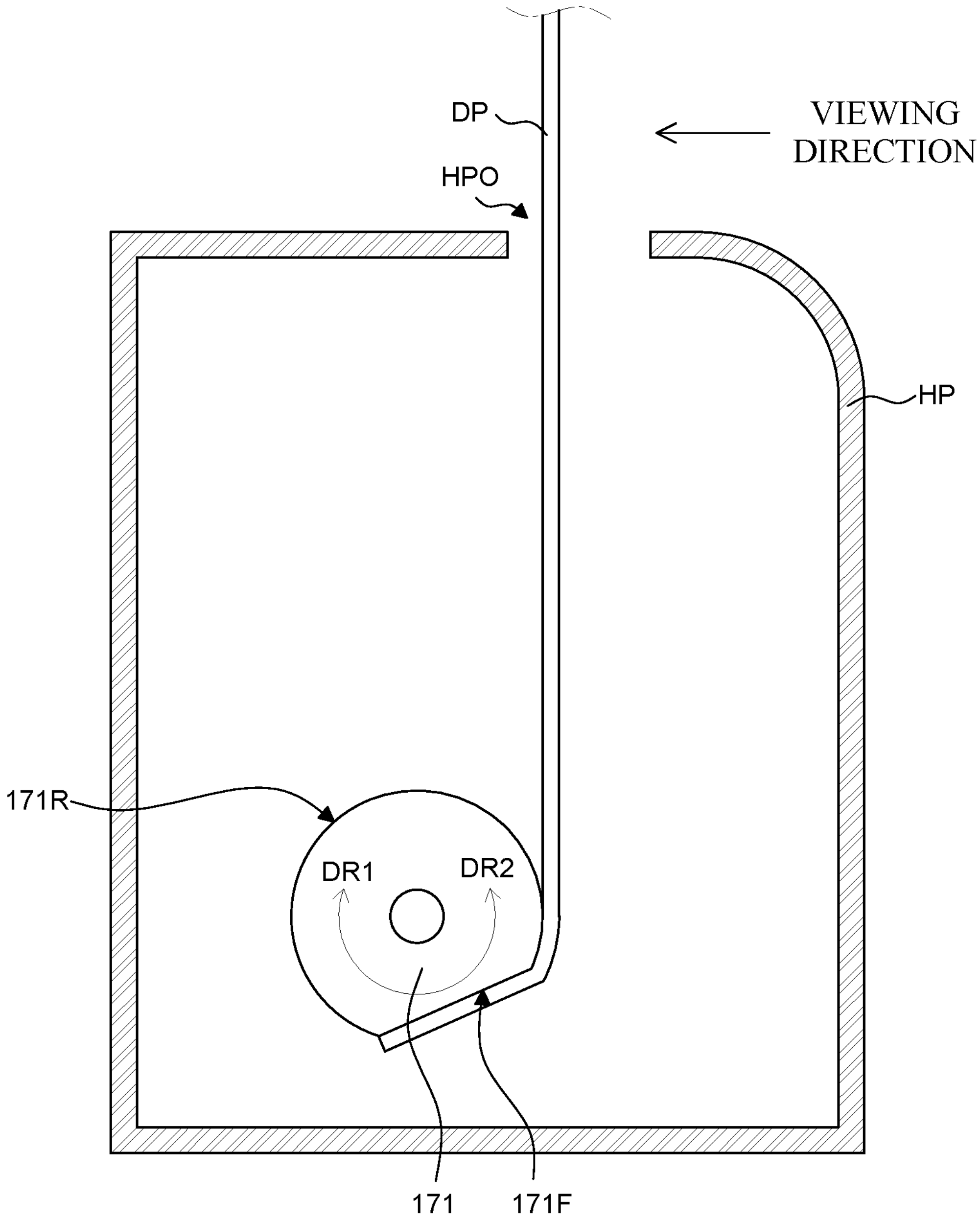
FIG. 3 is a schematic cross-sectional view of a display device according to an exemplary embodiment of the present disclosure.

FIG. 2 is a perspective view of a display device according to an exemplary embodiment of the present disclosure. FIG. 3 is a schematic cross-sectional view of a display device according to an exemplary embodiment of the present disclosure. FIG. 3 is a schematic cross-sectional view for explaining a roller 171 and a display unit DP of a display device 100 according to an exemplary embodiment of the present disclosure. For the convenience of description, in FIG. 3, only a housing unit HP, a roller 171, and a display unit DP are illustrated.

First, referring to FIG. 2, the driving unit MP includes a roller unit 170 and a lifting unit 180.

The roller unit 170 rotates in a clockwise direction or a counterclockwise direction to wind or unwind the display unit DP fixed to the roller unit 170. The roller unit 170 includes a roller 171 and a roller support unit 172.

The roller 171 is a member around which the display unit DP is wound. The roller 171 may be, for example, formed to have a cylindrical shape. A lower edge of the display unit DP may be fixed to the roller 171. When the roller 171 rotates, the display unit DP which is fixed to the roller 171 through the lower edge may be wound to the roller 171. In contrast, when the roller 171 rotates in an opposite direction, the display unit DP which is wound to the roller 171 may be unwound from the roller 171.

Referring to FIG. 3, the roller 171 may be formed to have a cylindrical shape in which at least a part of an outer circumferential surface of the roller 171 is flat and the remaining part of the outer circumferential surface is a curved portion. Even though the roller 171 may have entirely a cylindrical shape, but a part thereof may be formed of a flat surface. That is, a part of the outer circumferential surface of the roller 171 is formed to be flat and the remaining part of the outer circumferential surface is formed as a rounded surface. For example, the roller 171 is configured by a rounded portion 171R and a flat portion 171F and in the flat portion 171F of the roller 171, the plurality of flexible films and/or the printed circuit board of the display unit DP are seated. However, the roller 171 may have a completely cylindrical shape or an arbitrary shape which may wind the display unit DP, but is not limited thereto.

Referring to FIG. 2 again, the roller support unit 172 supports the roller 171 at both sides of the roller 171. Specifically, the roller support unit 172 is disposed on a bottom surface HPF of the housing unit HP. Upper surfaces of the roller support unit 172 are coupled to both ends of the roller 171. By doing this, the roller support unit 172 may support the roller 171 to be spaced apart from the bottom surface HPF of the housing unit HP. In this case, the roller 171 may be rotatably coupled to the roller support unit 172.

The lifting unit 180 moves the display unit DP in a vertical direction in accordance with the driving of the roller unit 170. The lifting unit 180 includes a link unit 181, a head bar 182, a motor 183, and a rotary unit 184.

The link unit 181 of the lifting unit 180 includes a plurality of links 181*a* and 181*b* and a hinge unit 181*c* which connects the plurality of links 181*a* and 181*b* to each other. Specifically, the plurality of links 18la and 181*b* includes a first link 181*a* and a second link 181*b* and the first link 181*a* and the second link 181*b* cross each other in the form of scissors to be rotatably fastened by means of the hinge unit 181*c*. When the link unit 181 moves in the vertical direction, the plurality of links 181*a* and 181*b* rotates to be far away from each other or close to each other. The link unit 181 may be configured by a plurality of links 181*a* and 181*b* which intersects each other, but it is not limited so that the link unit may be configured by a single link which does not intersect.

The head bar 182 of the lifting unit 180 is fixed to an uppermost end of the display unit DP. The head bar 182 is coupled to the link unit 181 to move the display unit DP in the vertical direction in accordance with the rotation of the plurality of links 181*a* and 181*b* of the link unit 181. That is, the display unit DP may move in a vertical direction by the head bar 182 and the link unit 181.

The head bar 182 covers only a part of a surface which is adjacent to an uppermost edge of the display unit DP so as not to hide an image displayed on the front surface of the display unit DP. The display unit DP and the head bar 182 may be fixed by a screw, but are not limited thereto.

The motor 183 is connected to a power generating unit, such as a separate external power source or a built-in battery, to be supplied with the power. The motor 183 generates a torque to provide a driving force to the rotary unit 184.

The rotary unit 184 is connected to the motor 183 to be configured to convert a rotational motion from the motor 183 into a linear reciprocating motion. That is, the rotational motion of the motor 183 may be converted into the linear reciprocating motion of a structure fixed to the rotary unit 184. For example, the rotary unit 184 may be implemented by a ball screw including a shaft and a nut which is fastened with the shaft, but is not limited thereto.

The motor 183 and the rotary unit 184 interwork with the link unit 181 to lift and lower the display unit DP. The link unit 181 is formed with a link structure to receive the driving force from the motor 183 and the rotary unit 184 to be repeatedly folded or unfolded.

Specifically, when the display unit DP is wound, the motor 183 is driven so that the structure of the rotary unit 184 may perform the linear motion. That is, a part of the rotary unit 184 to which one end of the second link 181*b* is coupled may perform the linear motion. Therefore, one end of the second link 181*b* moves toward the motor 183 and the plurality of links 181*a* and 181*b* is folded so that the height of the link unit 181 may be reduced. Further, while the plurality of links 181*a* and 181*b* are folded, the head bar 182 coupled to the first link 181*a* is also lowered and one end of the display unit DP coupled to the head bar 182 is also lowered.

When the display unit DP is unwound, the motor 183 is driven so that the structure of the rotary unit 184 may perform linear motion. That is, a part of the rotary unit 184 to which one end of the second link 181*b* is coupled may perform the linear motion. Therefore, one end of the second link 181*b* moves to be away from the motor 183 and the plurality of links 181*a* and 181*b* is unfolded so that the height of the link unit 181 may be increased. Further, while the plurality of links 181*a* and 181*b* is unfolded, the head bar 181 coupled to the first link 181*a* is also lifted and the display unit DP coupled to the head bar 182 is also lifted.

Accordingly, when the display unit DP is fully wound to the roller 171, the link unit 181 of the lifting unit 180 maintains a folded state. That is, when the display unit DP is fully wound to the roller 171, the lifting unit 180 may have a smallest height. In contrast, when the display unit DP is fully unwound, the link unit 180 of the lifting unit 181 maintains an unfolded state. That is, when the display unit DP is fully unwound, the lifting unit 180 may have a largest height.

In the meantime, when the display unit DP is wound, the roller 171 may rotate and the display unit DP may be wound to the roller 171. Referring to FIG. 3, for example, the display unit DP is coupled to the roller 171. When the roller 171 rotates in a first direction DR1, that is, a clockwise direction, the display unit DP may be wound while a rear surface of the display unit DP is in close contact with an outer surface of the roller 171.

When the display unit DP is unwound, the roller 171 may rotate and the display unit DP may be unwound from the roller 171. For example, referring to FIG. 3, when the roller 171 rotates in a second direction DR2, that is, in a counter-clockwise direction, the display unit DP which is wound to the roller 171 is unwound from the roller 171 to be disposed at the outside of the housing unit HP.

In some exemplary embodiments, a driving unit having another structure other than the above-described driving unit may be applied to the display device 100. That is, as long as the display unit DP is wound and unwound, the above-described configuration of the roller unit 170 and the lifting unit 180 may be modified, some configurations may be omitted, or another configuration may be added.

Display Unit

Figure 4:
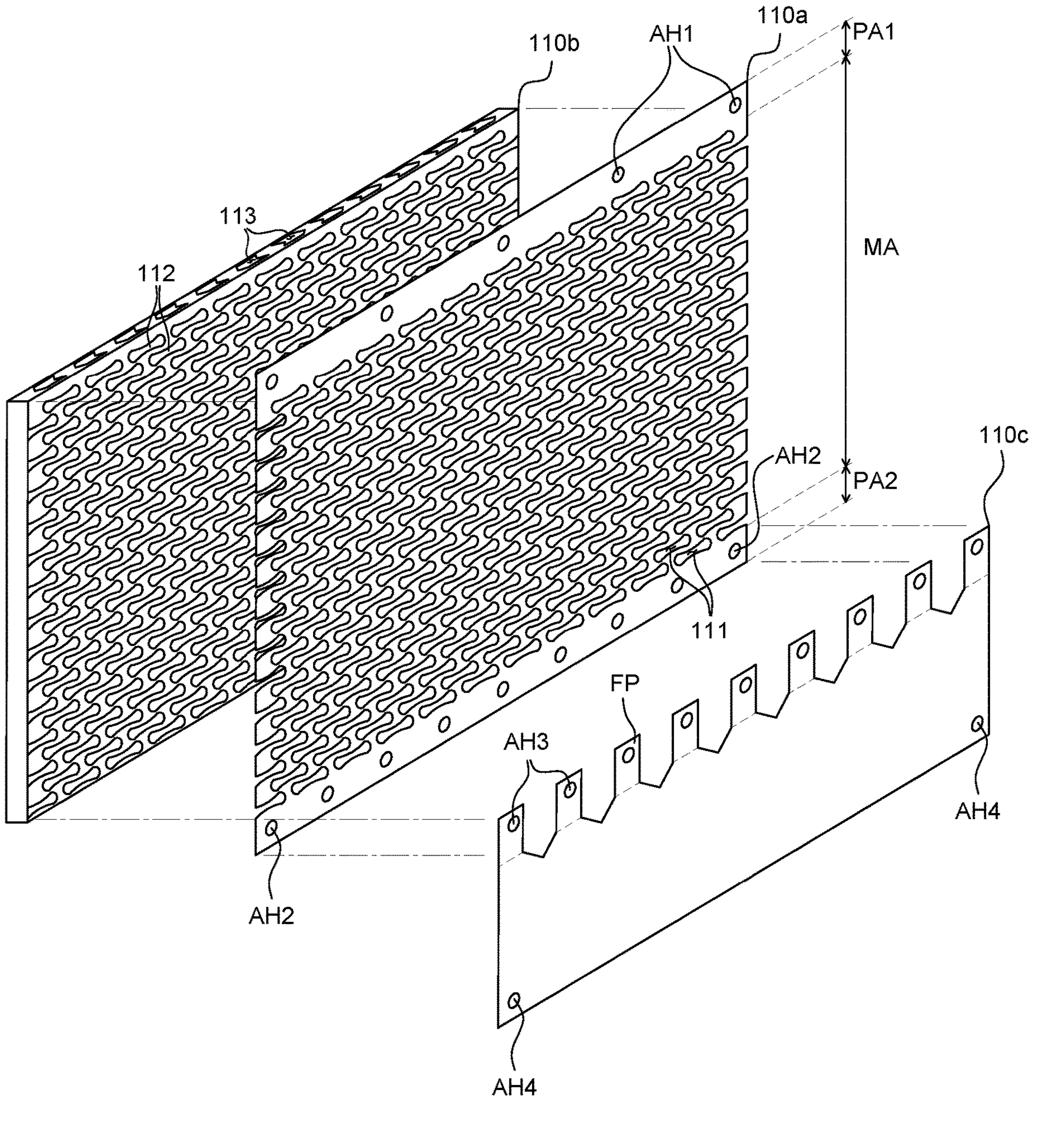
FIG. 4 is an exploded perspective view for explaining a first cover, a second cover, and a third cover of a display device according to an exemplary embodiment of the present disclosure.
Figure 5:
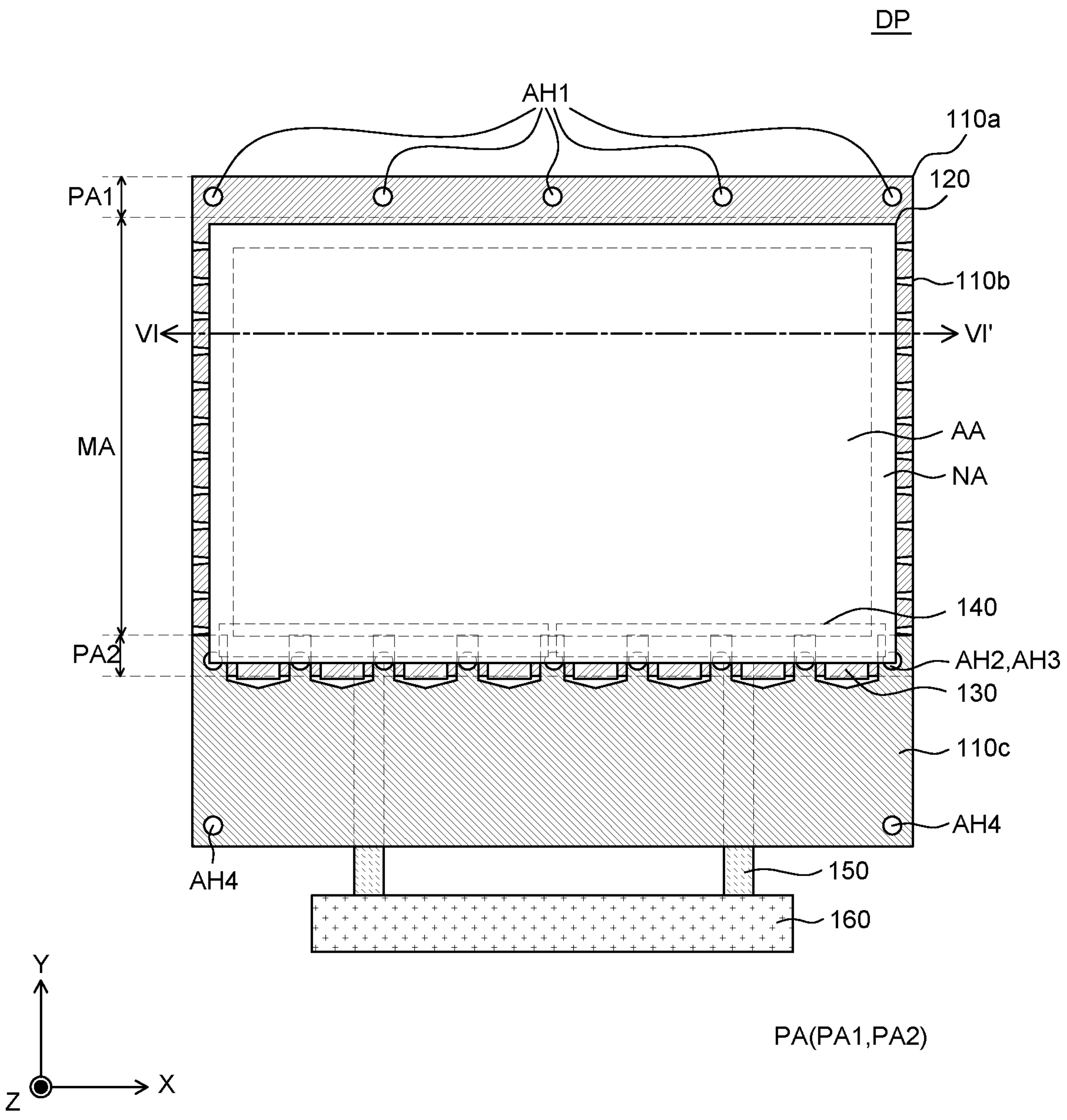
FIG. 5 is a plan view of a display unit of a display device according to an exemplary embodiment of the present disclosure.
Figure 6:
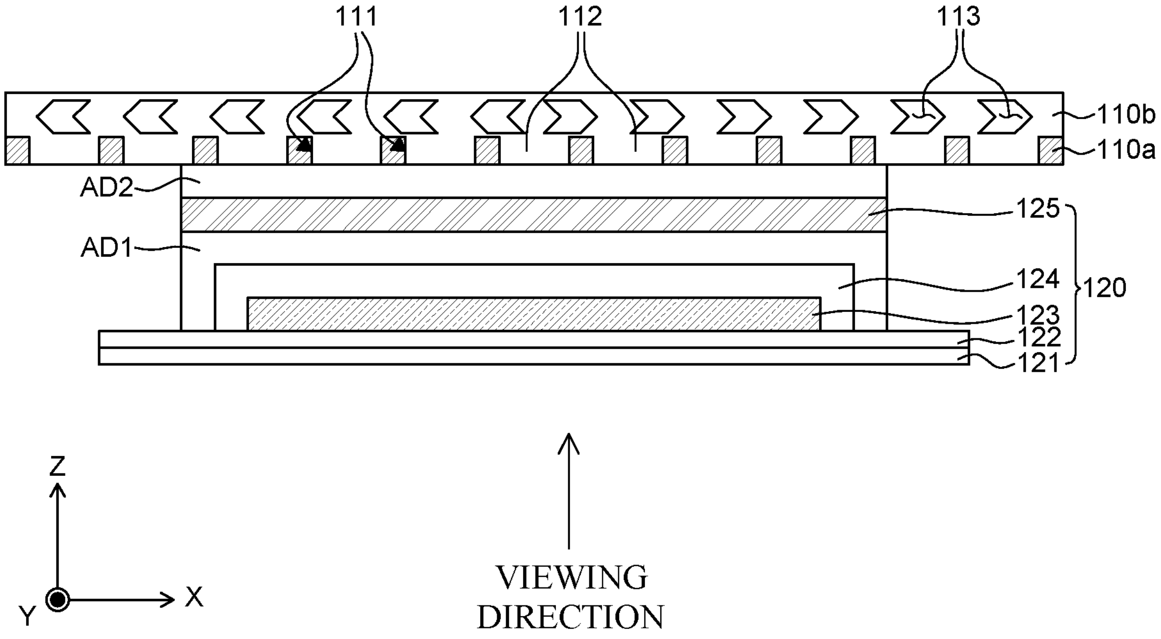
FIG. 6 is a cross-sectional view taken along the line VI-VI' of FIG. 5, according to an embodiment of the present disclosure.

FIG. 4 is an exploded perspective view for explaining a first cover, a second cover, and a third cover of a display device according to an exemplary embodiment of the present disclosure. FIG. 5 is a plan view of a display unit of a display device according to an exemplary embodiment of the present disclosure. FIG. 6 is a cross-sectional view taken along the line VI-VI' of FIG. 5, according to an embodiment of the present disclosure.

Referring to FIGS. 4 to 6, the display unit DP includes a first cover 110*a*, a second cover 110*b*, a third cover 110*c*, a display panel 120, a plurality of flexible films 130, a first printed circuit board 140, a flexible cable 150, and a second printed circuit board 160. However, it is not limited thereto and the display unit DP may be defined to include only the display panel 120, the plurality of flexible films 130, the first printed circuit board 140, the flexible cable 150, and the second printed circuit board 160.

First, referring to FIGS. 4, 5 and 6, the first cover 110*a* is disposed on a rear surface of the display panel 120 to support the display panel 120. The first cover 110*a* is disposed on the rear surface of the display panel 120 so that the first cover may be referred to as a back cover. A size of the first cover 110*a* may be larger than a size of the display panel 120. The first cover 110*a* may protect other configurations of the display unit DP from the outside. The first cover 110*a* may be fastened with the head bar 182 and the third cover 110*c*. Further, the first cover 110*a* may be coupled to the second cover 110*b* and the third cover 110*c*.

Even though the first cover 110*a* is formed of a material having a rigidity, at least a part of the first cover 110*a* may have a flexibility to be wound or unwound together with the display panel 120. For example, the first cover 110*a* may be formed of a metal material such as steel use stainless (SUS) or invar or plastic. However, if the material of the first cover 110*a* satisfies physical conditions, such as a thermal strain, a radius of curvature, and a rigidity, the material may be diversely changed depending on the design, and is not limited thereto.

The first cover 110*a* includes a plurality of support areas PA and a malleable area MA. The plurality of support areas PA is areas where a plurality of openings 111 is not disposed and the malleable area MA is an area where a plurality of openings 111 is disposed. Here, the plurality of openings 111 refers to holes which are formed to pass through the first cover 110*a* along a thickness direction of the first cover 110*a*.

The first cover 110*a* includes a first support area PA1, a malleable area MA, and a second support area PA2 and the first support area PA1, the malleable area MA, and the second support area PA2 are sequentially disposed from an uppermost end of the first cover 110*a*. The plurality of support areas PA and the malleable area MA may be disposed along the Y-axis direction. Here, the Y-axis direction refers to a winding or unwinding direction of the display unit DP. Further, the X-axis direction refers to a direction parallel to a rotation axis of the roller 171. Further, the Z-axis direction refers to a thickness direction of the display panel 120, the first cover 110*a*, the second cover 110*b*, and the third cover 110*c*.

The first support area PA1 of the first cover 110*a* is an uppermost area of the first cover 110*a* and is fastened with the head bar 182. The first support area PA1 includes first fastening holes AH1 to be fastened with the head bar 182. For example, screws which pass through the head bar 182 and the first fastening holes AH1 are disposed so that the head bar 182 is fastened with the first support area PA1. As the first support area PA1 is fastened with the head bar 182, when the link unit 182 which is fastened with the head bar 181 is lifted or lowered, the first cover 110*a* is also lifted and lowered together, and the display panel 120 which is attached to the first cover 110*a* is also lifted and lowered. Even though five first fastening holes AH1 are illustrated in FIGS. 4 and 5, the number of first fastening holes AH1 is not limited thereto. Further, even though it has been described that the first cover 110*a* is fastened with the head bar 182 using the first fastening holes AH1, it is not limited thereto and the first cover 110*a* and the head bar 182 may be fastened with each other without using a separate fastening hole.

The malleable area MA of the first cover 110*a* is an area extending from the first support area PA1 to a lower side of the first cover 110*a*. The malleable area MA is an area in which a plurality of openings 111 is disposed and the display panel 120 is attached. Specifically, the malleable area MA is an area which is wound to or unwound from the roller 171 together with the display panel 120. The malleable area MA may overlap at least the display panel 120 among other configurations of the display unit DP.

The second support area PA2 of the first cover 110*a* is an area which extends from the malleable area MA and is a lowermost area of the first cover 110*a*. One end of the display panel 120 is disposed in the second support area PA2. For example, a pad area which is a non-active area at one end of the display panel 120 may be disposed in the second support area PA2. Second fastening holes AH2 are disposed in the second support area PA2. Even though nine second fastening holes AH2 are illustrated in FIG. 4, the number of second fastening holes AH2 is illustrative and is not limited thereto.

In the meantime, in the first support area PA1 and the second support area PA2, the plurality of openings 111 formed in the malleable area MA is not formed. Specifically, in the first support area PA1 and the second support area PA2, only the first fastening holes AH1 and the second fastening holes AH2 are formed, but the plurality of openings 111 is not formed. Further, the first fastening holes AH1 and the second fastening holes AH2 have different shapes from that of the plurality of openings 111.

The first support area PA1 is an area fixed to the head bar 182 and the second support area PA2 is an area where one end of the display panel 120, the plurality of flexible films 130, and the first printed circuit board 140 are supported and has a rigidity larger than that of the malleable area MA. Further, as the first support area PA1 and the second support area PA2 have the rigidity, the first support area PA1 and the second support area PA2 may be firmly fixed to the head bar 182 and the third cover 110*c*. The second support area PA2 maintains the pad area at one end of the display panel 120 and the first printed circuit board 140 to be flat to protect the pad area and the first printed circuit board 140 of the display panel 120. Therefore, the display unit DP is fixed to the head bar 182 of the driving unit MP to move to the inside or the outside of the housing unit HP in accordance with the operation of the driving unit MP and protect the pad area and the first printed circuit board 140 at one end of the display panel 120.

In the meantime, in FIG. 5, even though it is illustrated that the plurality of support areas PA and the malleable area MA of the first cover 110*a* are sequentially disposed along the Y direction. However, when the first cover 110*a* is wound in an X-axis direction, the plurality of support areas PA and the malleable area MA may be sequentially disposed along the X-axis direction.

When the display unit DP is wound or unwound, the plurality of openings 111 disposed in the malleable area MA of the first cover 110*a* may be deformed by a stress which is applied to the display unit DP. Specifically, when the display unit DP is wound or unwound, the malleable area MA of the first cover 110*a* may be deformed as the plurality of openings 111 contracts or expands. Further, as the plurality of openings 111 contracts or expands, a slip phenomenon of the display panel 120 disposed on the malleable area MA of the first cover 110*a* is minimized so that the stress which is applied to the display panel 120 may be minimized.

Referring to FIGS. 4 and 6, the second cover 110*b* is disposed on the rear surface of the first cover 110*a*. That is, the second cover 110*b* is disposed on the rear surface of the display panel 120 together with the first cover 110*a* to support the display panel 120. The second cover 110*b* corresponds to the malleable area MA of the first cover 110*a*. That is, the second cover 110*b* overlaps the malleable area MA to have the same area as the malleable area MA. The second cover 110*b* is fixed to the firs cover 110*a*.

The second cover 110*b* may include a plurality of protrusions 112. The plurality of protrusions 112 may be disposed on a surface of the second cover 110*b* which is opposite to the first cover 110*a*. The plurality of protrusions 112 is inserted into the plurality of openings 111. Therefore, the first cover 110*a* and the second cover 110*b* are attached to each other by the coupling of the plurality of protrusions 112 and the plurality of openings 111.

Specifically, the first cover 110*a* and the second cover 110*b* may be bonded by a hot press process. First, after disposing a resin sheet on a rear surface of the first cover 110*a*, the first cover 110*a* and the resin sheet are pressed using an upper mold and a lower mold to perform the hot press process. Therefore, a part of a material which configures the resin sheet is pressed by the mold to be inserted into the plurality of openings 111 of the first cover 110*a*. After the hot press process, the resin sheet may be attached to the first cover 110*a* to be cured. Here, the second cover 110*b* refers to a resin sheet which is cured after the hot press process. Further, a constitution material of the resin sheet which is inserted into the plurality of openings 111 of the first cover 110*a* may refer to the plurality of protrusions 112. Accordingly, the first cover 110*a* and the second cover 110*b* are fixed to each other to be coupled.

The second cover 110*b* is formed of an elastic resin. That is, the second cover 110*b* may have a flexibility to be wound or unwound together with the display panel 120. Therefore, when the display unit DP is wound or unwound, the plurality of protrusions 112 may be deformed together with the plurality of openings 111. Accordingly, even though the plurality of protrusions 112 is inserted into the plurality of openings 111, a rolling characteristic is maintained. Further, the second cover 110*b* may disperse the stress which is applied to the display unit DP during the winding or unwinding. Accordingly, a stress applied to the display panel 120, that is, a stress may be minimized.

The second cover 110*b* may include a plurality of variable holes 113. The plurality of variable holes 113 may be formed by inserting a variant-processed metal plate into the resin sheet during the hot press process. Here, the variant-processed metal plate refers to a metal plate which is surface-processed so as to be easily separated. Specifically, the hot press process is performed while inserting the variant-processed metal plate into the resin sheet and the variant-processed metal plate is separated after the hot press process. Therefore, a variable hole 113 having the same shape as the variant-processed metal plate is formed in the second cover 110*b*.

The plurality of variable holes 113 may be configured to pass through the second cover 110*b*. The plurality of variable holes 113 may extend in a direction parallel to one surface of the second cover 110*b*. That is, the plurality of variable holes 113 is formed to pass through the second cover 110*b* in a direction perpendicular to the thickness direction of the second cover 110*b*. The plurality of variable holes 113 may be configured to contract or expand while winding or unwinding of the display unit DP. In the meantime, in FIG. 6, six variable holes 113 disposed at the left side and six variable holes 113 disposed at the right side are symmetrically disposed, but are not limited thereto. That is, the number of variable holes 113 and the shape thereof may vary depending on the design. The plurality of variable holes 113 will be described below with reference to FIGS. 7 to 8B.

The third cover 110*c* is fastened with the first cover 110*a* and the roller 171 to connect the first cover 110*a* and the roller 171. The third cover 110*c* connects the first cover 110*a* and the roller 171 by the above-described method and finally connects the display panel 120 disposed on the first cover 110*a* to the roller 171. However, it is not limited thereto so that as long as the third cover 110*c* is connected to the first cover 110*a* and the roller 171, a shape or a connection method of the third cover 110*c* may vary in various ways depending on the design and is not limited thereto.

One end of the third cover 110*c* which is an uppermost area of the third cover 110*c* overlaps one end of the first cover 110*a*. For example, one end of the third cover 110*c* may overlap the second support area PA2. One end of the third cover 110*c* overlaps a part of the first cover 110*a* to be connected or one end of the third cover 110*c* is connected to the part of the first cover 110*a* using a connection member, but is not limited thereto.

The third cover 110*c* may include a plurality of fastening units FP overlapping the first cover 110*a*. The plurality of fastening units FP is disposed at one end of the second cover 110*c*. Further, in the plurality of fastening units FP, a plurality of third fastening holes AH3 to be fastened with the first cover 110*a* may be disposed. The plurality of fastening units FP in which the plurality of third fastening holes AH3 is disposed is spaced apart from each other and a space which allows the plurality of flexible films 130 to be bent may be ensured between the plurality of fastening units FP. Even though nine third fastening holes AH3 are illustrated in FIG. 4, the number of third fastening holes AH3 is illustrative and is not limited thereto.

In FIG. 4, it is described that the second fastening holes AH2 and the third fastening holes AH3 to fasten the first cover 110*a* and the third cover 110*b* with each other are disposed in one end of the second support area PA2 of the first cover 110*a* and the third cover 110*c*, respectively. However, the first cover 110*a* and the third cover 110*c* may be fixed to each other without using a separate fastening hole.

In the meantime, when the second support area PA2 and the plurality of fastening units FP are wound to the roller 171, an outer circumferential surface of the roller 171 which overlaps the second support area PA2 and the plurality of fastening units FP may be a flat portion 171F. Therefore, the second support area PA2 may always maintain the flat state regardless of the wound or unwound state to the roller 171 and the pad area at one end of the display panel 120 and the first printed circuit board 140 disposed in the second support area PA2 may also maintain the flat state.

An area from one end to the other end of the third cover 110*c* is an area which extends to dispose the active area AA of the display panel 120 at the outside of the housing unit HP. For example, when the first cover 110*a* and the display panel 120 are fully unwound, an area from the other end of the third cover 110*c* which is fixed to the roller 171 to one end of the third cover 110*c* in which the plurality of flexible films 130 and the printed circuit board 140 are disposed may be disposed in the housing unit HP. The malleable area MA and the first support area PA1 in which the active area AA of the display panel 120 is disposed may be disposed at the outside of the housing unit HP. That is, an area from the other end of the third cover 110*c* fixed to the roller 171 to at least a part of an end of the third cover 110*c* and the second support area PA2 may be disposed in the housing unit HP.

The other end of the third cover 110*c* is a lowermost area of the third cover 110*c* and is fastened with the roller 171. A fourth fastening hole AH4 may be formed at the other end of the third cover 110*c* to be fastened with the roller 171. For example, a fastening member which passes through the roller 171 and the fourth fastening holes AH4 is disposed so that the roller 171 and the other end of the third cover 110*c* are fastened with each other. As the other end of the third cover 110*c* is fastened with the roller 171, the display panel 120, the first cover 110*a*, the second cover 110*b*, and the third cover 110*c* may be wound to or unwound from the roller 171. Even though two fourth fastening holes AH4 are illustrated in FIG. 4, the number of fourth fastening holes AH4 is not limited thereto.

In the meantime, in the third cover 110*c*, the plurality of openings 111 as formed in the malleable area MA of the first cover 110*a* is not formed. Specifically, only the third fastening holes AH3 and the fourth fastening holes AH4 are formed at one end and the other end of the third cover 110*c*, but the plurality of openings 111 as formed in the malleable area MA of the first cover 110*a* is not formed. Further, the third fastening hole AH3 and the fourth fastening hole AH4 have different shapes from that of the plurality of openings 111.

The third cover 110*c* may be formed of a flexible material to be wound to or unwound from the roller. For example, the third cover 110*c* may be formed of a plastic material such as PET. However, if the material of the third cover 110*c* satisfies physical conditions, such as a thermal strain, a radius of curvature, and a rigidity, the material may be diversely changed depending on the design, and is not limited thereto.

Referring to FIGS. 5 and 6, the display panel 120 is disposed on one surface of the first cover 110*a*. That is, the display panel 120 is disposed on an opposite surface of a surface of the first cover 110*a* on which the second cover 110*b* is disposed. The display panel 120 is disposed in the malleable area MA of the first cover 110*a*. The display panel 120 is a panel for displaying images to a user. The display panel 120 may include a display element which displays images, a driving element which drives the display element, and wiring lines which transmit various signals to the display element and the driving element.

The display element may be defined in different manners depending on the type of the display panel 120. For example, when the display panel 120 is an organic light emitting display panel 120, the display element may be an organic light emitting diode which includes an anode, an organic emission layer, and a cathode. For example, when the display panel 120 is a liquid crystal display panel, the display element may be a liquid crystal display element. Hereinafter, even though the display panel 120 is assumed as an organic light emitting display panel, the display panel 120 is not limited to the organic light emitting display panel. Further, since the display device 100 according to the exemplary embodiment of the present disclosure is a rollable display device 100, the display panel 120 may be implemented as a flexible display panel 120 to be wound to or unwound from the roller 171.

The display panel 120 includes an active area AA and a non-active area NA.

The active area AA is an area where images are displayed in the display panel 120. In the active area AA, a plurality of sub pixels which configures the plurality of pixels and a driving circuit for driving the plurality of sub pixels may be disposed. The plurality of sub pixels is minimum units which configure the active area AA and a display element may be disposed in each of the plurality of sub pixels. For example, an organic light emitting diode which includes an anode, an organic emission layer, and a cathode may be disposed in each of the plurality of sub pixels, but it is not limited thereto. Further, a driving circuit for driving the plurality of sub pixels may include a driving element and a wiring line. For example, the driving circuit may be configured by a thin film transistor, a storage capacitor, a gate line, and a data line, but is not limited thereto.

The non-active area NA is an area where no image is displayed. In the non-active area NA, various wiring lines and circuits for driving the organic light emitting diode of the active area AA are disposed. For example, in the non-active area NA, a link line which transmits signals to the plurality of sub pixels and driving circuits of the active area AA or a driving IC such as a gate driver IC or a data driver IC may be disposed, but the non-active area is not limited thereto.

In the meantime, the non-active area NA includes a pad area and a gate driving area.

The pad area is an area in which a plurality of pads is disposed. The plurality of pads is electrodes which electrically connect the plurality of flexible films 130 and the display panel 120 to each other so that the plurality of flexible films 130 and the display panel 120 are electrically connected by the plurality of pads. The pad area may be a non-active area NA which overlaps the second support area PA2 of the first cover 110*a* in the non-active area NA. However, the pad area may be formed in the other part of the non-active area NA depending on the arrangement of the plurality of flexible films 130, but is not limited thereto.

The gate driving area is an area where a gate driver is disposed. The gate driving area may be a non-active area NA at a left side and a right side of the active area AA. The gate driver outputs a gate voltage and an emission control voltage under the control of the timing controller to select a sub pixel in which a data voltage is charged through a wiring line such as a gate line or an emission control signal line and adjust an emission timing. Hereinafter, it is assumed that the gate driver is formed directly on the substrate 121 by a gate-driver in panel (GIP) method, but is not limited thereto. In this case, the gate driving area where the gate driver is disposed may also be referred to as a GIP area.

Referring to FIG. 5, the display panel 120 includes a substrate 121, a buffer layer 122, a pixel unit 123, an encapsulation layer 124, and an encapsulation substrate 125.

The substrate 121 is a base member which supports various components of the display panel 120 and may be configured by an insulating material. The substrate 121 may be formed of a material having a flexibility to allow the display panel 120 to be wound or unwound. For example, the substrate 121 may be formed of a plastic material such as polyimide.

The buffer layer 122 is disposed on a top surface of the substrate 121. The buffer layer 122 suppresses moisture and/or oxygen which penetrates from the outside of the substrate 121 from being spread. The buffer layer 122 may be formed of an inorganic material, for example, may be configured by a single layer or a double layer of silicon oxide SiOx and silicon nitride SiNx, but is not limited thereto.

The pixel unit 123 is disposed on upper surfaces of the substrate 121 and the buffer layer 122. The pixel unit 123 includes a plurality of organic light emitting diodes and a circuit for driving the plurality of organic light emitting diodes. The pixel unit 123 may be disposed so as to correspond to the active area AA.

In the meantime, the display panel 120 may be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed only of a transparent conductive material and the cathode may be formed of the metal material having a high reflectance to allow the light emitted from the organic light emitting diode to travel to the lower portion of the substrate 121.

Hereinafter, for the convenience of description, the description will be made by assuming that the display device 100 according to an exemplary embodiment of the present disclosure is a bottom emission type display device, but it is not limited thereto.

An encapsulation layer 124 is disposed to cover the pixel unit 123. The encapsulation layer 124 seals the organic light emitting diode of the pixel unit 123. The encapsulation layer 124 may protect the organic light emitting diode of the pixel unit 123 from moisture, oxygen, and impacts of the outside. The encapsulation layer 124 may be formed by alternately laminating a plurality of inorganic layers and a plurality of organic layers. For example, the inorganic layer may be formed of an inorganic material such as silicon nitride (SiNx), silicon oxide (SiOx), and aluminum oxide (AlOx) and the organic layer may be formed of epoxy or acrylic polymer, but they are not limited thereto.

The encapsulation substrate 125 is disposed on the encapsulation layer 124. Specifically, the encapsulation substrate 125 is disposed between the encapsulation layer 124 and the first cover 110*a*. The encapsulation substrate 125 protects the organic light emitting diode of the pixel unit 123 together with the encapsulation layer 124. The encapsulation substrate 125 may protect the organic light emitting diode of the pixel unit 123 from moisture, oxygen, and impacts of the outside. The encapsulation substrate 125 may be formed of a material having a high modulus of approximately 200 to 900 MPa. The encapsulation substrate 125 may be formed of a metal material, which has a high corrosion resistance and is easily processed in the form of a foil or a thin film, such as aluminum (Al), nickel (Ni), chromium (Cr), and an alloy material of iron (Fe) and nickel. Therefore, as the encapsulation substrate 125 is formed of a metal material, the encapsulation substrate 125 may be implemented as an ultra-thin film and provide a strong resistance against external impacts and scratches.

A first adhesive layer AD1 is disposed between the encapsulating layer 124 and the encapsulating substrate 125. The first adhesive layer ADI may bond the encapsulation layer 124 and the encapsulation substrate 125 to each other. The first adhesive layer AD1 is formed of a material having adhesiveness and may be a thermosetting or natural curable type adhesive. For example, the first adhesive layer AD1 may be formed of an optical clear adhesive (OCA) or a pressure sensitive adhesive (PSA), but is not limited thereto.

In the meantime, the first adhesive layer AD1 may be disposed so as to enclose the encapsulation layer 124 and the pixel unit 123. That is, the pixel unit 123 may be sealed by the buffer layer 122 and the encapsulation layer 124 and the encapsulation layer 124 and the pixel unit 123 may be sealed by the buffer layer 122 and the first adhesive layer AD1. The first adhesive layer AD1 may protect the organic light emitting diode of the pixel unit 123 from moisture, oxygen, and impacts of the outside together with the encapsulation layer 124 and the encapsulation substrate 125. In this case, the first adhesive layer AD1 may further include an absorbent. The moisture absorbent may be particles having hygroscopicity and absorb moisture and oxygen from the outside to minimize permeation of the moisture and oxygen into the pixel unit 123.

A second adhesive layer AD2 is disposed between the encapsulating substrate 125 and the first cover 110*a*. The second adhesive layer AD2 may bond the encapsulating substrate 125 and the first cover 110*a* to each other. The second adhesive layer AD2 is formed of a material having adhesiveness and may be a thermosetting or natural curable type adhesive. For example, the second adhesive layer AD2 may be formed of an optical clear adhesive (OCA) or a pressure sensitive adhesive (PSA), but is not limited thereto.

Even though not illustrated in the drawing, a polarizer may be disposed on a rear surface of the display panel 120. The polarizer selectively transmits light to reduce the reflection of external light which is incident onto the display panel 120. Specifically, the display panel 120 includes various metal materials applied to the semiconductor element, the wiring line, and the organic light emitting diode. Therefore, the external light incident onto the display panel 120 may be reflected from the metal material so that the visibility of the display device 100 may be reduced due to the reflection of the external light. Therefore, when the polarizer is disposed, the polarizer suppresses the reflection of the external light to increase the outdoor visibility of the display device 100. However, the polarizer may be omitted depending on an implementation example of the display device 100.

Referring to FIG. 5, a plurality of flexible films 130 is disposed at one end of the display panel 120. Specifically, the plurality of flexible films 130 may be disposed in a lower end portion of the display panel 120 adjacent to the second support area PA2. The plurality of flexible films 130 is films in which various components are disposed on a base film having a malleability and supplies a signal to the plurality of sub pixels and the driving circuits which configure the active area AA and is electrically connected to the display panel 120. One ends of the plurality of flexible films 130 are disposed in the non-active area NA of the display panel 120 to supply a power voltage or a data voltage to the plurality of sub pixels and the driving circuits of the active area AA. In the meantime, even though the plurality of flexible films 130 is eight in FIG. 5, the number of flexible films 130 may vary depending on the design, but is not limited thereto.

A driving IC such as a gate driver IC or a data driver IC may be disposed on the base films of the plurality of flexible films 130. The driving IC is a component which processes data for displaying images and a driving signal for processing the data. The driving IC may be disposed by a chip on glass (COG), a chip on film (COF), or a tape carrier package (TCP) technique depending on a mounting method.

The plurality of flexible films 130 is electrically connected to the pad area at one end of the display panel 120 to be bent toward a rear surface of the first cover 110*a*. One ends of the plurality of flexible films 130 are connected to one end of the display panel 120 on one surface of the first cover 110*a* and the other ends of the plurality of flexible films 130 may be disposed at an opposite surface of the one surface of the first cover 110*a*, but is not limited thereto.

Referring to FIG. 5, the first printed circuit board 140 is disposed on a rear surface of the first cover 110*a*. The first printed circuit board 140 is electrically connected to the plurality of flexible films 130. The first printed circuit board 140 is a component which supplies signals to the driving IC of the plurality of flexible films 130. The first printed circuit board 140 supplies various signals such as a driving signal or a data signal to the driving IC. Various components for supplying various signals to the driving IC may be disposed on the first printed circuit board 140. For example, a data driver which generates data signals may be mounted in the first printed circuit board 140 and the generated data signals may be supplied to the plurality of sub pixels and the driving circuit of the display panel 120 through the plurality of flexible films 130. The first printed circuit board 140 may be referred to as a source printed circuit board S-PCB. In the meantime, even though two first printed circuit boards 140 are illustrated in FIG. 5, the number of first printed circuit boards 140 may vary depending on the design and is not limited thereto.

The flexible cable 150 is disposed on the rear surface of the third cover 110*c*. The flexible cable 150 is electrically connected to one end of the first printed circuit board 140. Specifically, the first printed circuit board 140 is connected to one end of the flexible film 150 and the second printed circuit board 160 is connected to the other end. Therefore, the first printed circuit board 140 and the second printed circuit board 160 are electrically connected by the flexible cable 150. The flexible cable 150 may be, for example, a flexible flat cable (FFC), but is not limited thereto.

The second printed circuit board 160 is electrically connected to the other end of the flexible cable 150. The second printed circuit board 160 may be electrically connected to the first printed circuit board 140 through the flexible cable 150. For example, the second printed circuit board 160 may supply a timing signal or a power signal for controlling the driving IC, such as a gate driver IC or a data driver IC, to the driving IC. For example, in the second printed circuit board 160, IC chips, such as a timing controller or a power controller, which generate a gate control signal such as a gate start pulse, a gate shift pulse, or a gate output enable signal and a data control signal such as a source start pulse, a source sampling clock, or a source output enable signal may be mounted. The second printed circuit board 160 may be referred to as a control printed circuit board C-PCB.

The second printed circuit board 160 is disposed in the roller 171. That is, in the roller 171, there is an internal space for accommodating the second printed circuit board 160. The flexible cable 150 extends from the internal space of the roller 171 to the outside. That is, the roller 171 may include a hole through which the flexible cable 150 is withdrawn from the internal space to the outside. Specifically, in FIG. 5, the second printed circuit board 160 which extends to a lower portion of the third cover 110*c* may be disposed in the internal space of the roller 171. Further, the flexible cable 150 extending to the lower portion of the third cover 110*c* may be an area disposed in the internal space of the roller 171 or the hole. The flexible cable 150 overlapping the third cover 110*c* may be wound to or unwound from the roller 171 together with the third cover 110*c*.

Second Cover

Figure 7:
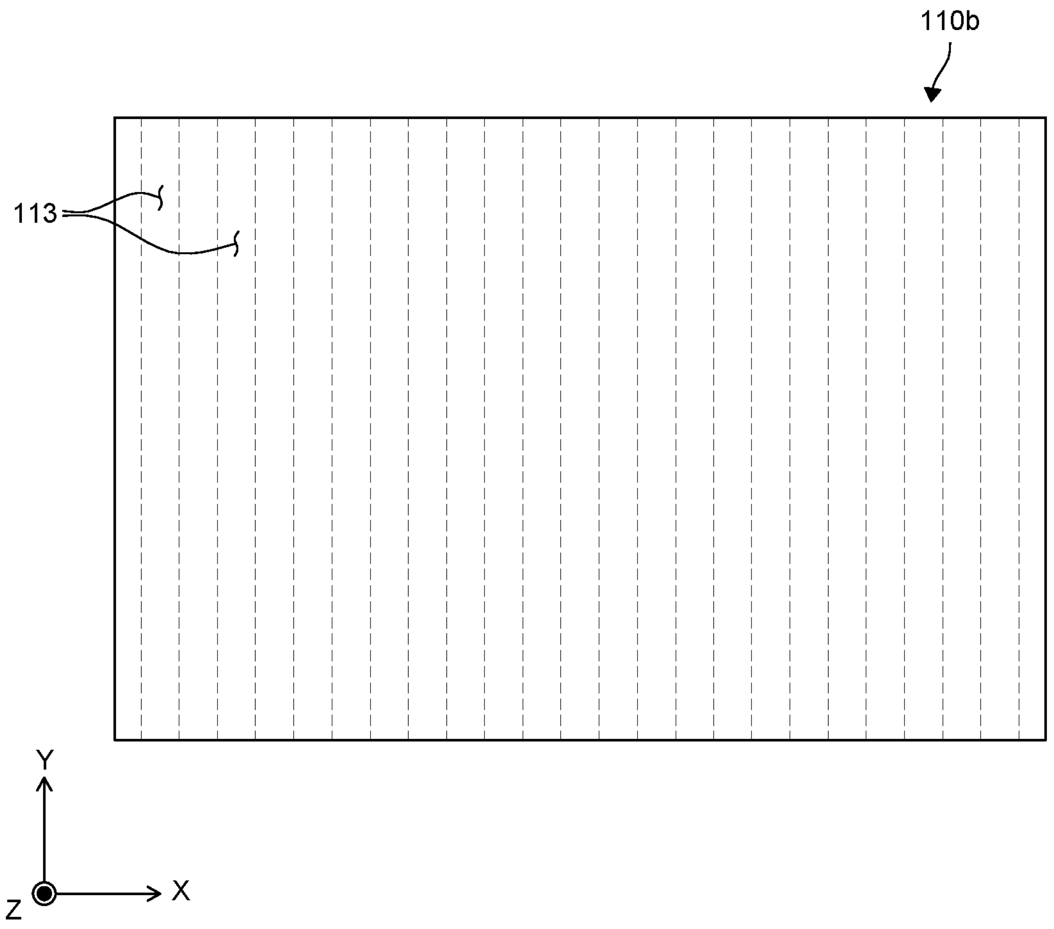
FIG. 7 is a plan view of a second cover of a display device according to an exemplary embodiment of the present disclosure.

FIG. 7 is a plan view of a second cover of a display device according to an exemplary embodiment of the present disclosure. FIG. 7 may be a plan view of the second cover 110*b* seen from a rear surface.

Referring to FIG. 7, the second cover 110*b* may include a plurality of variable holes 113. The plurality of variable holes 113 may extend in a direction parallel to one surface of the second cover 110*b*. The plurality of variable holes 113 may be formed to pass through the second cover 110*b*. Specifically, the plurality of variable holes 113 is formed to pass through the second cover 110*b* along a Y-axis direction in which the second cover 110*b* is wound or unwound. That is, the plurality of variable holes 113 may extend in a direction perpendicular to the rotation axis of the roller 171. Even though in FIG. 7, 12 variable holes 113 are illustrated, it is not limited thereto.

The plurality of variable holes 113 of the second cover 110*b* is configured to contract or expand. Therefore, the thickness of the second cover 110*b* may vary when the display unit DP is wound or unwound. Hereinafter, the contraction and expansion of the plurality of variable holes 113 of the second cover 110*b* will be described in detail with reference to FIGS. 8A and 8B.

Figure 8A:
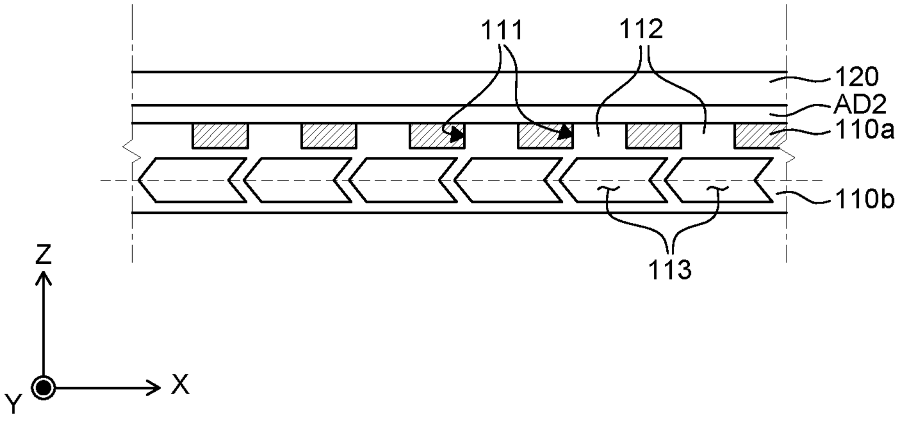
FIGS. 8A and 8B are cross-sectional views for explaining contraction or expansion of a second cover of a display device according to an exemplary embodiment.
Figure 8B:
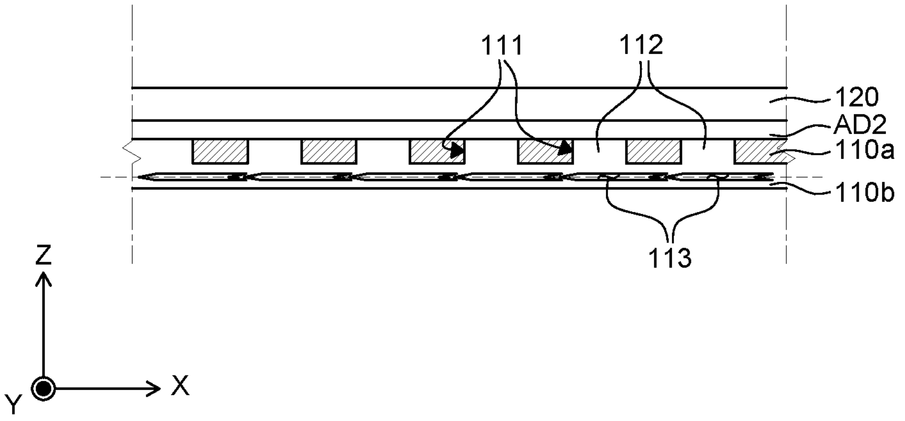

FIGS. 8A and 8B are cross-sectional views for explaining contraction or expansion of a second cover of a display device according to an exemplary embodiment. FIG. 8A is a cross-sectional view when the second cover 110*b* expands. FIG. 8B is a cross-sectional view when the second cover 110*b* is contracted.

First, referring to FIG. 8A, the plurality of variable holes 113 may have a symmetrical shape with respect to an imaginary plane inside the second cover 110*b*. The imaginary plane refers to a surface on the same plane as a dotted line of FIGS. 8A and 8B. The imaginary plane may be a surface parallel to a front surface and a rear surface between the front surface and the rear surface of the second cover 110*b*. One end and the other end of the plurality of variable holes 113 may be formed to have vertices corresponding to the imaginary plane. One side and the other side of the plurality of variable holes 113 may have the same cross-sectional shape. That is, with respect to FIG. 8A, a left cross-sectional shape and a right cross-section shape of the plurality of variable holes 113 may be the same. For example, one side of the variable hole 113 may have a pointed shape toward the outside of the variable hole 113. Further, the other side of the variable hole 113 may have a pointed shape toward the inside of the variable hole 113. Therefore, the plurality of variable holes 113 may be easily contracted or expand in the Z-axis direction which is the thickness direction. However, the shape of the plurality of variable holes 113 is not limited thereto so that the plurality of variable holes 113 may have any shape to be easily contracted or expand.

In the meantime, in FIG. 8A, the plurality of variable holes 113 is expanded. Specifically, when the display unit DP is unwound from the roller 171, the plurality of variable holes 113 may expand. That is, in the unwound state of the display unit DP, the second cover 110*b* does not have force to compress the second cover 110*b* so that the plurality of variable holes 113 expands. The second cover 110*b* mas the largest thickness due to the expansion of the plurality of variable holes 113. Here, the thickness of the second cover 110*b* may refer to a distance from a top surface of the protrusion 112 which is in contact with the second adhesive layer AD2 to a rear surface of the second cover 110*b*. Further, the rigidity of the second cover 110*b* may be proportional to a cube of the thickness. In the unwound state of the display unit DP, the second cover 110*b* has the largest thickness so that the second cover 110*b* improves the rigidity of the display unit DP.

In the meantime, in FIG. 8B, the plurality of variable holes 113 may be contracted. Specifically, when the display unit DP is wound to the roller 171, the plurality of variable holes 113 may be contracted. That is, when the display unit DP is wound, a stress is applied to the second cover 110*b*. Specifically, components of the display unit DP wound to the roller 171 are in contact with each other so that a force which compresses the second cover 110*b* may be applied to the second cover 110*b*. Therefore, the plurality of variable holes 113 is contracted and the second cover 110*b* has the smallest thickness. Accordingly, a radius of the display unit DP wound to the roller 171 is minimized to minimize a volume during the rolling.

The display panel of the rollable display device is formed of a flexible material to be wound or unwound. However, the display panel is flexibly configured so that the rigid may be degraded. Therefore, in order to suppress this problem, a back cover formed of a metal material may be attached onto a rear surface of the display panel. At this time, the back cover is also flexibly configured with a thin thickness to be wound or unwound. Therefore, even though the back cover is disposed on the rear surface of the display panel, the display device may be damaged due to the thin thickness of the back cover by the external impact.

In the display device 100 according to the exemplary embodiment of the present disclosure, the first cover 110*a* is disposed on the rear surface of the display panel 120 and the second cover 110*b* is disposed on the rear surface of the first cover 110*a*. Therefore, the rigidity of the display device 100 may be further enhanced. Specifically, the first cover 110*a* and the second cover 110*b* may be configured by different materials. That is, the first cover 110*a* is formed of metal and the second cover 110*b* is formed of a resin. The second cover 110*b* is formed of an elastic material so that the impact applied to the display unit DP may be dispersed. Accordingly, the stress of the display unit DP is further relieved and the reliability may be improved.

The first cover 110*a* includes a plurality of openings 111 and the second cover 110*b* includes a plurality of protrusions 112. Here, the plurality of openings 111 passes through the first cover 110*a* in the thickness direction. Further, a plurality of protrusions 112 may be inserted into the plurality of openings 111. Therefore, the first cover 110*a* and the second cover 110*b* may be more firmly coupled by the coupling of the plurality of openings 111 and the plurality of protrusions 112.

The plurality of openings 111 relieves a stress applied to the display panel 120 while improving the rolling characteristic of the first cover 110*a*. At this time, the second cover 110*b* is formed of an elastic resin. Accordingly, even though the plurality of protrusions 111 is inserted into the plurality of openings 112, a rolling characteristic is maintained. Further, when the plurality of openings 111 is deformed, the plurality of protrusions 112 is also deformed. Specifically, the plurality of openings 111 and the plurality of protrusions 112 may be flexibly deformed by a stress applied during the winding or unwinding of the display unit DP. Therefore, when the display unit DP is wound, a stress applied to the display panel 120 is relieved by the first cover 110*a* and the second cover 110*b*.

The second cover 110*b* includes a plurality of variable holes 113 extending in a direction perpendicular to a rotation axis of the roller 171. That is, the plurality of variable holes 113 extends in a direction perpendicular to the thickness direction of the second cover 110*b* to pass through the second cover 110*b*. Further, the plurality of variable holes 113 is configured to be contractible or expandable. Specifically, when the display unit DP is wound, the plurality of variable holes 113 is contracted so that the second cover 110*b* has the smallest thickness. Accordingly, a radius of the display unit DP wound to the roller 171 is reduced to minimize a rolling size and the thin thickness suppresses the degradation of the rolling characteristic. When the display unit DP is unwound, the plurality of variable holes 113 expands so that the second cover 110*b* has the largest thickness. That is, the plurality of variable holes 113 which is contracted expands again by the elastic characteristic of the second cover 110*b*. Accordingly, in the unwound state, the first cover 110*a* and the second cover 110*b* may more firmly support the display panel 120. Therefore, the rigidity of the display device 100 may be further increased.

Figure 9:
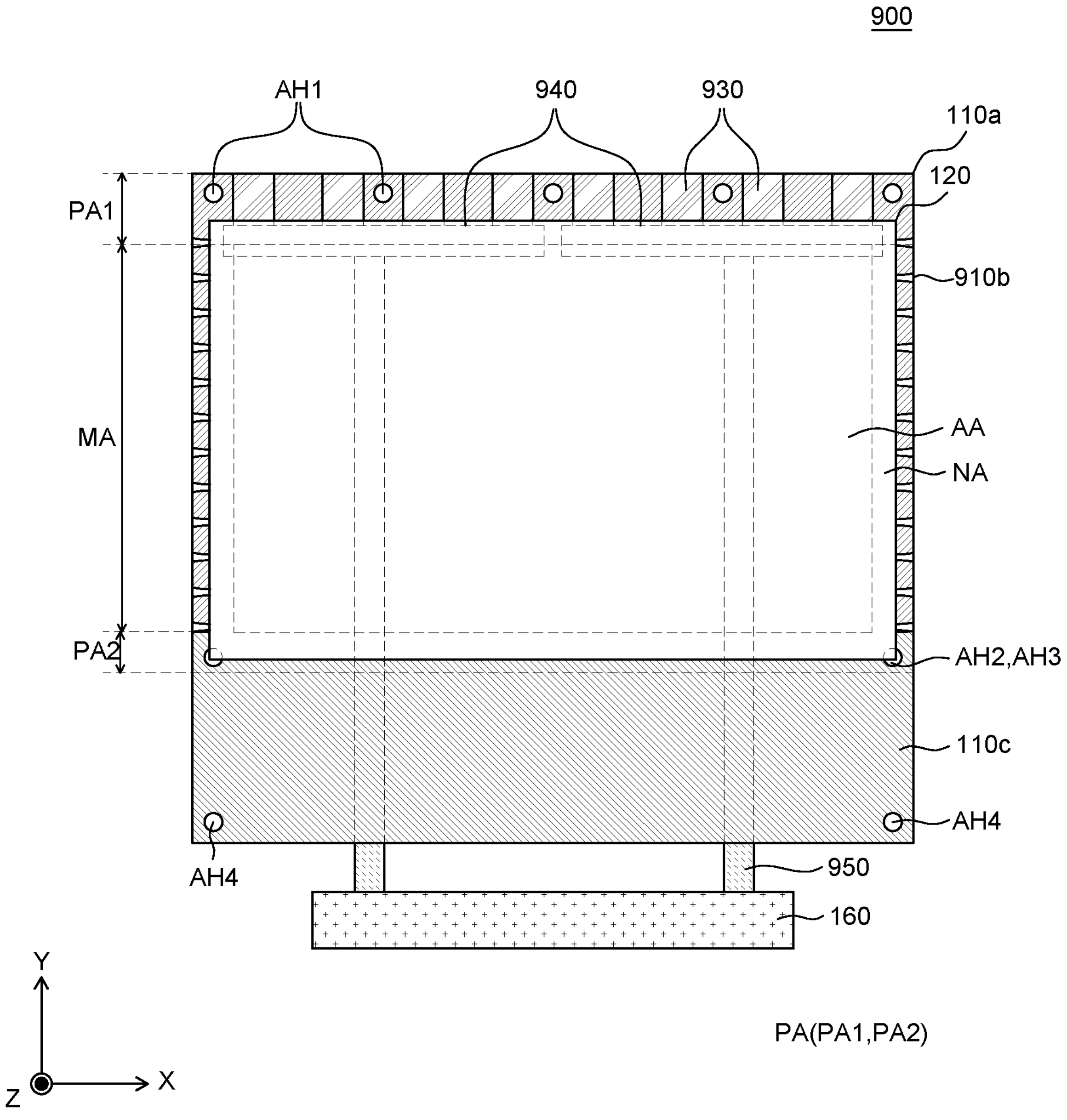
FIG. 9 is a plan view of a display unit of a display device according to another exemplary embodiment of the present disclosure.

FIG. 9 is a plan view of a display unit of a display device according to another exemplary embodiment of the present disclosure. A position of a plurality of flexible films 930, a position of a first printed circuit board 940, a position of a flexible cable 950, and a second cover 910 of a display device 900 of FIG. 9 are different from those of the display device 100 of FIGS. 1 to 7, but the others are the same. Accordingly, a redundant description will be omitted.

Referring to FIG. 9, the display unit DP of the display device 900 includes a first cover 110*a*, a second cover 910*b*, a third cover 110*c*, a display panel 120, a plurality of flexible films 930, a first printed circuit board 940, a flexible cable 950, and a second printed circuit board 160.

The plurality of flexible films 930 is disposed at one end of the display panel 120. Specifically, the plurality of flexible films 930 may be disposed in an upper end portion of the display panel 120 adjacent to the first support area PA1. In this case, the pad area of the display panel 120 may be formed so as to overlap the first support area PA1 of the first cover 110*a,* of the non-active area NA. The plurality of flexible films 930 is electrically connected to the pad area at one end of the display panel 120 to be bent toward a rear surface of the first cover 110*a*. One ends of the plurality of flexible films 930 are connected to one end of the display panel 120 on one surface of the first cover 110*a* and the other ends of the plurality of flexible films 930 may be disposed at an opposite surface of the one surface of the first cover 110*a,* but is not limited thereto.

The first printed circuit board 940 is disposed on a rear surface of the first cover 110*a*. The first printed circuit board 940 is electrically connected to the plurality of flexible films 930. That is, the first printed circuit board 940 is connected to the other end of the plurality of flexible films 930. The first printed circuit board 940 is disposed so as to overlap the first support area PA1.

In the meantime, the first support area PA1 is an area fastened with the head bar 182. That is, the plurality of flexible films 930 and the first printed circuit board 940 may be disposed in the head bar 182. The first support area PAI is an area which is more rigid than the malleable area MA and is firmly fixed to the head bar 182. Therefore, the pad area of the display panel 120 and the first printed circuit board 940 may maintain a flat state in the first support area PA1. Further, the pad area, the plurality of flexible films 930, and the first printed circuit board 940 may be protected by the head bar 182.

The flexible cable 950 electrically connects the first printed circuit board 940 and the second printed circuit board 160. That is, the first printed circuit board 940 is connected to one end of the flexible film 950 and the second printed circuit board 160 is connected to the other end. Specifically, the flexible cable 950 extends from the first printed circuit board 940 to the second printed circuit board 160 while overlapping the malleable area MA of the first cover 110*a,* the second cover 910*b,* and the third cover 110*c*. At this time, the flexible cable 950 may be disposed so as to pass through the second cover 910*b*. That is, the second cover 910*b* includes a cable hole 914 which accommodates the flexible cable 950. Hereinafter, structures of the flexible cable 950 and the second cover 910*b* will be described in detail with reference to FIGS. 10 to 11B.

Figure 10:
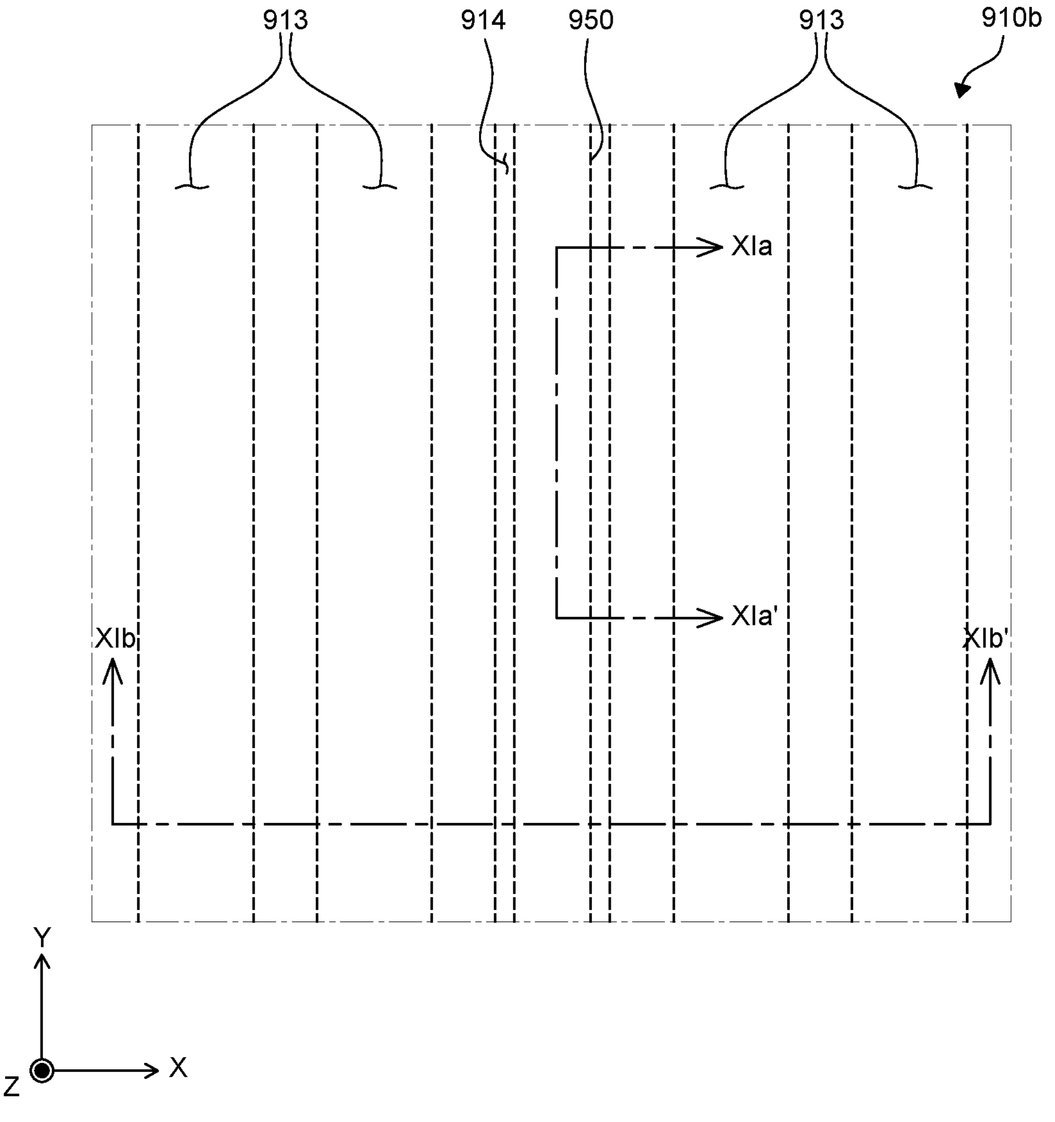
FIG. 10 is an enlarged plan view of a second cover of a display device according to another exemplary embodiment of the present disclosure.
Figure 11A:
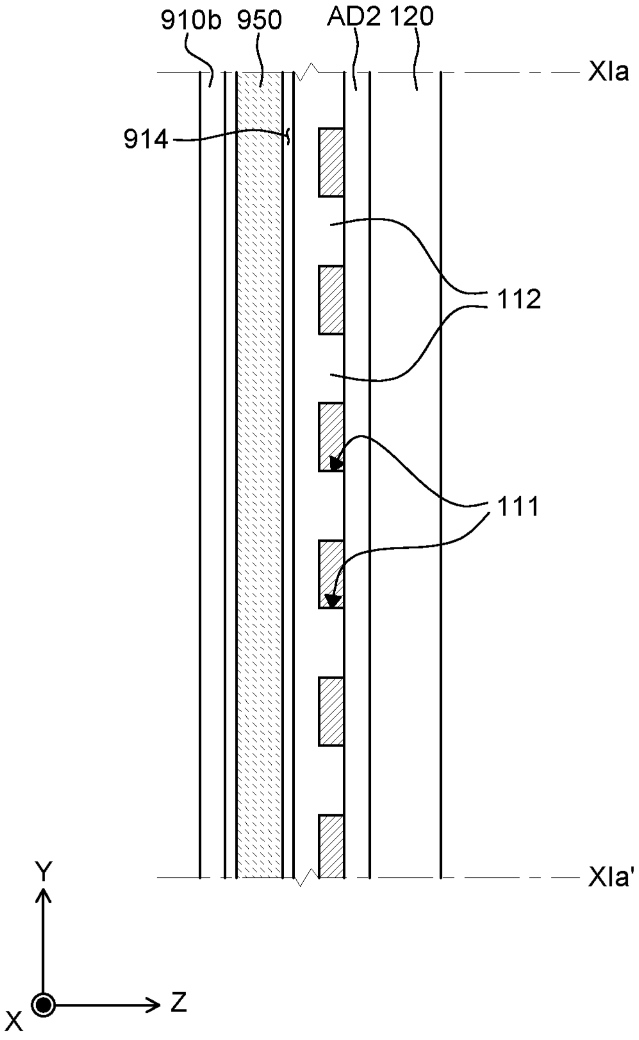
FIG. 11A is a cross-sectional view taken along the line XIa-XIa' of FIG. 10, according to an embodiment of the present disclosure.
Figure 11B:
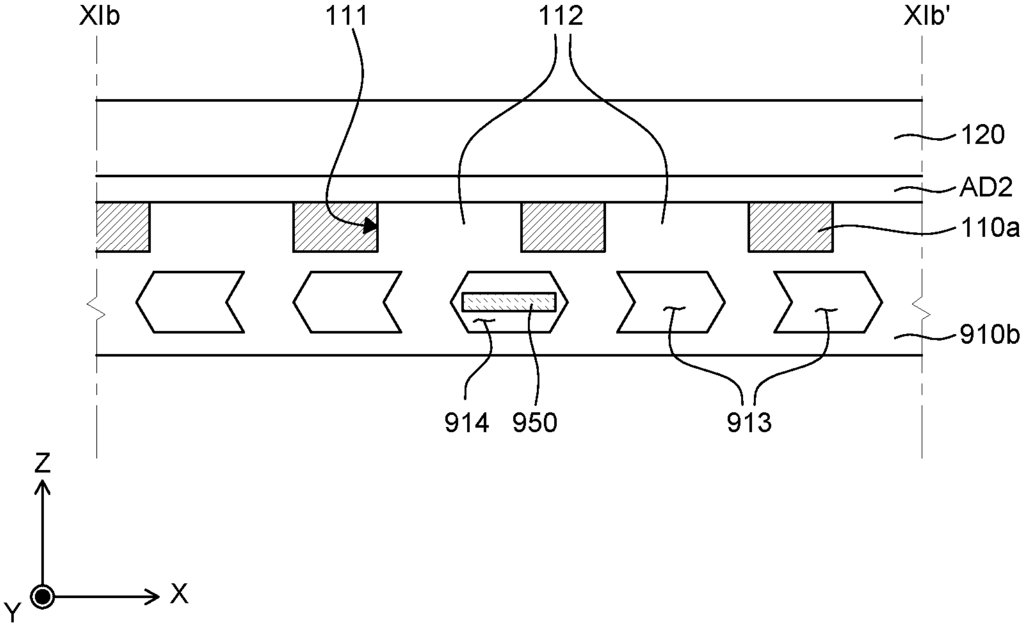
FIG. 11B is a cross-sectional view taken along the line XIb-XIb' of FIG. 10, according to an embodiment of the present disclosure.

FIG. 10 is an enlarged plan view of a second cover of a display device according to another exemplary embodiment of the present disclosure. FIG. 11A is a cross-sectional view taken along the line XIa-XIa' of FIG. 10, according to an embodiment of the present disclosure. FIG. 11B is a cross-sectional view taken along the line XIb-XIb' of FIG. 10, according to an embodiment of the present disclosure. FIG. 10 may be an enlarged plan view of an area of the second cover 910*b* which is adjacent to a cable hole 914.

Referring to FIGS. 10 to 11B, the second cover 910*b* includes a plurality of variable holes 913 and a cable hole 914.

The plurality of variable holes 913 may be configured to pass through the second cover 910*b*. The plurality of variable holes 913 may extend in a direction parallel to one surface of the second cover 910*b*. Further the plurality of variable holes 913 may extend in a direction perpendicular to an X-axis which is a rotation axis of the roller 171. The plurality of variable holes 913 may be configured to be contractible or expandable while winding or unwinding the display unit DP.

In the meantime, in FIG. 11B, it is illustrated that the plurality of variable holes 913 on both sides of the cable hole 914 is symmetrical, but the present disclosure is not limited thereto.

The cable hole 914 is a hole through which the flexible cable 950 passes. The cable hole 914 is formed so as to correspond to the number of flexible cables 950. The cable hole 914 extends in a direction parallel to the plurality of variable holes 913. That is, the cable hole 914 extends in a direction perpendicular to the rotation axis of the roller 171 while passing through the second cover 910*b*. Like the plurality of variable holes 913, the cable hole 914 is also configured to be contractible or expandable while winding or unwinding the display unit DP.

Referring to FIG. 11B, the plurality of variable holes 913 and the cable hole 914 may be formed to have different shapes. Specifically, one side and the other side of the plurality of variable holes 913 have the same cross-sectional shape, but one side and the other side of the cable hole 914 may have different cross-sectional shapes. One side of the plurality of variable holes 913 may have a pointed shape toward the outside of the variable hole 913 and the other side may have a pointed shape toward the inside of the variable hole 913. One side and the other side of the cable hole 914 may have a pointed shape toward the outside. That is, the cable hole 914 has a symmetrical cross-section in a horizontal direction. Both sides of the cable hole 914 outwardly protrude so that the flexible cable 950 may be easily accommodated in the cable hole 914. Further, even though the cable hole 914 is contracted, the friction between the inner surface of the cable hole 914 and the flexible cable 950 may be minimized.

In the meantime, in the display device 900 according to another exemplary embodiment of the present disclosure, the plurality of flexible cable 930 and the first printed circuit board 940 are disposed in the head bar 182. Therefore, the roller 171 may be formed to have a perfectly cylindrical shape, but is not limited thereto. Further, a portion of the third cover 110*c* which is connected to the first cover 110*a* includes only the third fastening hole AH3 without having a plurality of fastening units FP, and an upper portion is configured in a line. When the roller 171 is formed in a perfectly cylindrical shape, the second support area PA2 may be omitted. Further, the first cover 110*a* and the third cover 110*c* are integrally formed and the third cover 110*c* is formed to include a plurality of openings 111, but the present disclosure is not limited thereto.

The display device 900 according to another exemplary embodiment of the present disclosure disposes a second cover 910*b* formed of an elastic resin on a rear surface of the first cover 110*a*. Therefore, even though the external impact is applied to the display device 900, it is more effectively relieved. Specifically, the second cover 910*b* includes a plurality of variable holes 913 which is contractible or expandable. When the second cover 910*b* is unwound, the second cover has the largest thickness due to the expansion of the plurality of variable holes 913 and when the second cover is wound, has the smallest thickness due to the contraction of the plurality of variable holes 913. Therefore, the second cover 910*b* serves to reinforce the rigidity of the display device 900 during the unwinding and suppress the degradation of the rolling characteristic during the winding.

In the display device 900 according to another exemplary embodiment of the present disclosure, the plurality of flexible cable 930 and the first printed circuit board 940 are disposed in the head bar 182. That is, the plurality of flexible films 930 and the first printed circuit board 940 may be disposed in a position regardless of the winding or unwinding. Therefore, the damage of the plurality of flexible films 930 and the first printed circuit board 940 is suppressed and the reliability of the display device 900 is improved.

The first printed circuit board 940 in the head bar 182 and the second printed circuit board 160 in the roller 171 are connected by the flexible cable 950. At this time, the flexible cable 950 may be accommodated in the cable hole 914 formed to pass through the second cover 910*b*. Therefore, the external exposure of the flexible cable 950 is suppressed to reduce the damage of the flexible cable 950. Specifically, the flexible cable 950 is disposed in the second cover 910*b* formed of an elastic resin so that the flexible cable 950 may be more effectively protected. Accordingly, the defect of the display device 900 may be suppressed.

Figure 12A:
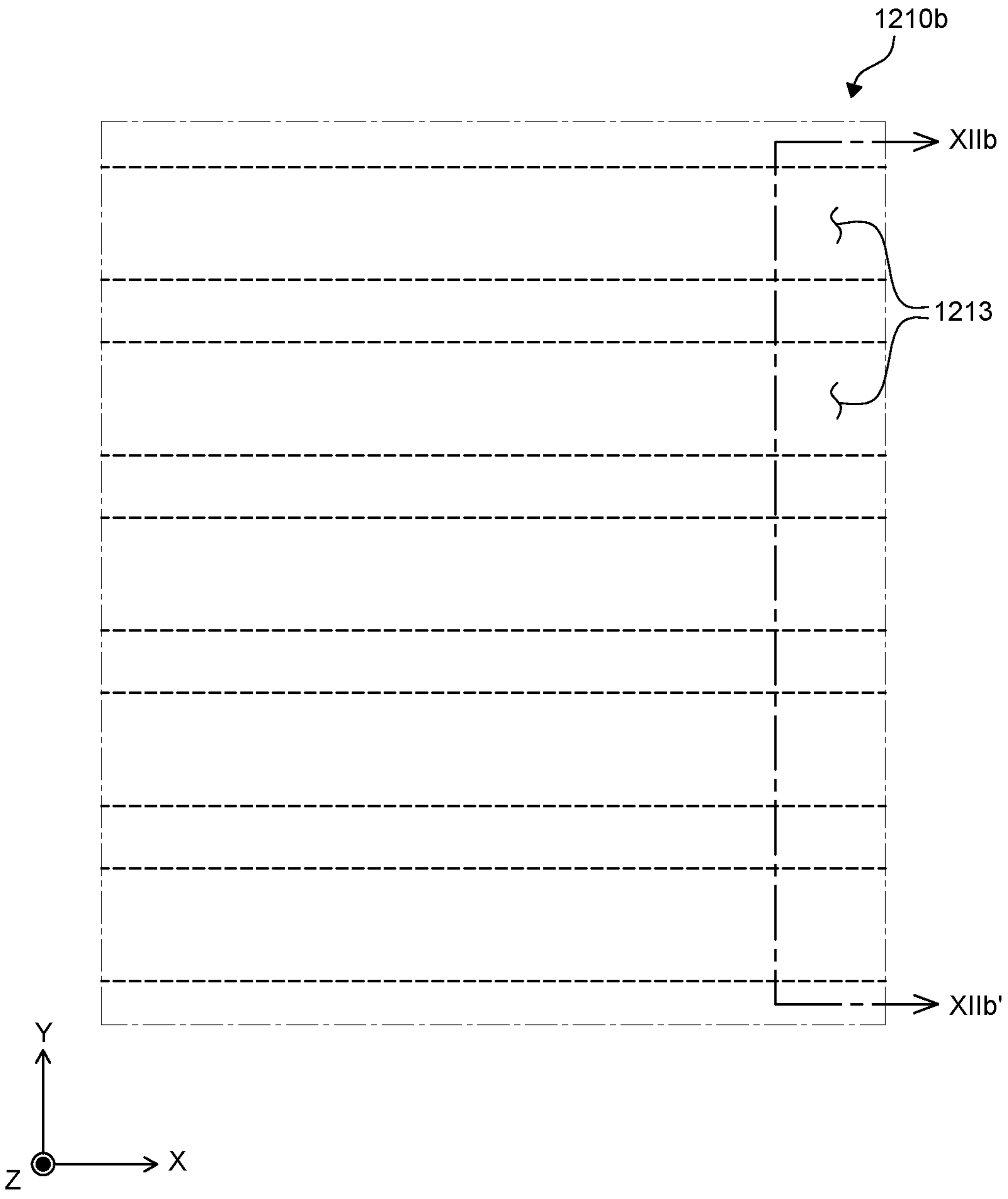
FIG. 12A is an enlarged plan view of a second cover of a display device according to still another exemplary embodiment of the present disclosure.
Figure 12B:
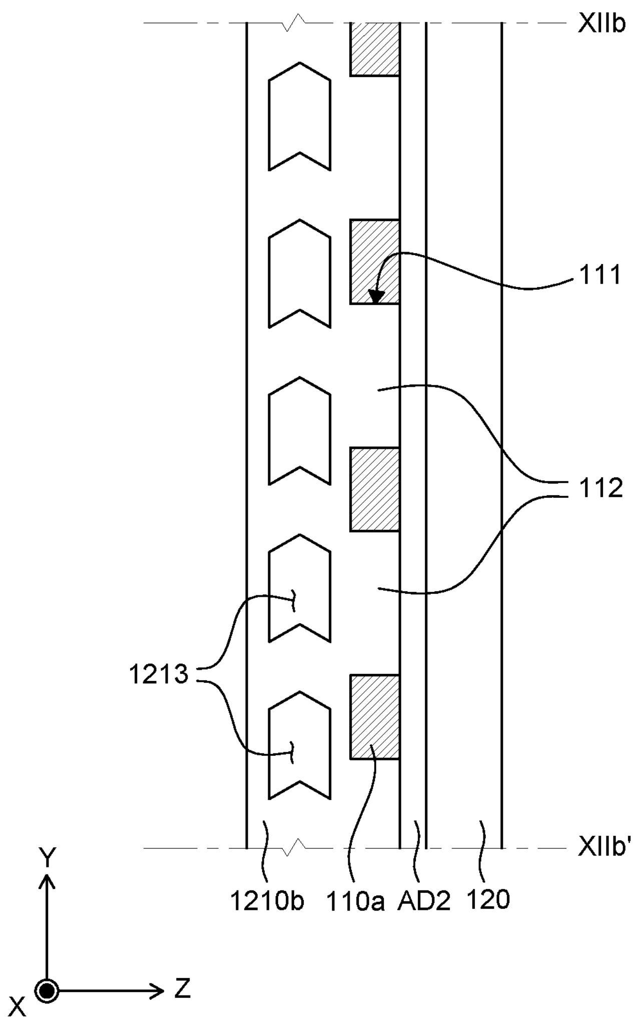
FIG. 12B is a cross-sectional view taken along the line XIIb-XIIb' of FIG. 12A, according to an embodiment of the present disclosure.

FIG. 12A is an enlarged plan view of a second cover of a display device according to still another exemplary embodiment of the present disclosure. FIG. 12B is a cross-sectional view taken along the line XIIb-XIIb' of FIG. 12A, according to an embodiment of the present disclosure. Only a second cover 1210*b* of a display device of FIGS. 12A and 12B is different from that of the display device 100 of FIGS. 1 to 7, but the others are the same. Accordingly, a redundant description will be omitted.

Referring to FIGS. 12A and 12B, the second cover 1210*b* may include a plurality of variable holes 1213.

The plurality of variable holes 1213 may be configured to pass through the second cover 1210*b*. The plurality of variable holes 1213 may extend in a direction parallel to one surface of the second cover 1210*b*. Further the plurality of variable holes 1213 may extend in a direction parallel to an X-axis which is a rotation axis of the roller 171. The plurality of variable holes 1213 may be configured to be contractible or expandable while winding or unwinding of the display unit DP.

The display device according to still another exemplary embodiment of the present disclosure disposes a second cover 1210*b* formed of an elastic resin on a rear surface of the first cover 110*a*. Therefore, even though the external impact is applied to the display device, it is more effectively relieved. Specifically, the second cover 1210*b* includes a plurality of variable holes 1213 which is contractible or expandable. When the second cover 1210*b* is unwound, the second cover has the largest thickness due to the expansion of the plurality of variable holes 1213 and when the second cover is wound, has the smallest thickness due to the contraction of the plurality of variable holes 1213. Therefore, the second cover 1210*b* serves to reinforce the rigidity of the display device during the unwinding and suppress the degradation of the rolling characteristic during the winding.

Specifically, the plurality of variable holes 1213 may extend in a direction parallel to the rotation axis of the roller 171. Therefore, the second cover 1210*b* may be more flexibly deformed when the display unit DP is wound. Specifically, when the second cover 1210*b* is wound, the second cover may be bent in a Y-axis direction which is perpendicular to the rotation axis and a stress is applied to the plurality of variable holes 1213 to extend in the Y-axis direction. At this time, the longer the length in the X-axis direction, the longer the length to extend in the Y-axis direction during the winding. Further, the longer the length to extend in the Y-axis direction, the less the stress to be applied to the second cover 1210*b*. In the display device according to another exemplary embodiment of the present disclosure, the plurality of variable holes 1213 extends in the X-axis direction to pass through the second cover 1210*b*. Accordingly, the length of the plurality of variable holes 1213 in the X-axis direction is much longer than the length in the Y-axis direction. Therefore, the second cover 1210*b* may easily contract or expand. Further, the impact relieving effect of the second cover 1210*b* is further improved to improve the durability of the display device.

Figure 13:
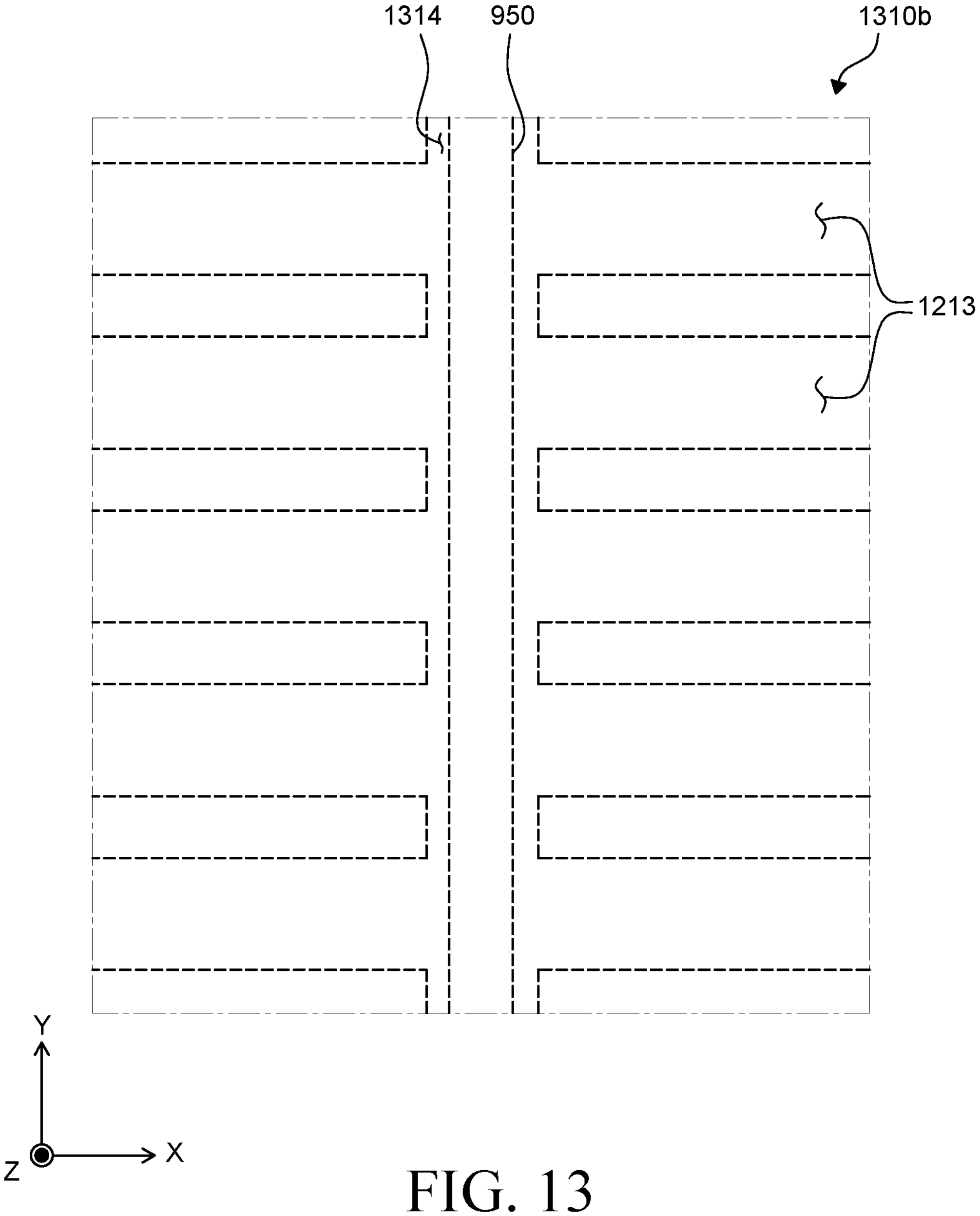
FIG. 13 is an enlarged plan view of a second cover of a display device according to still another exemplary embodiment of the present disclosure.

FIG. 13 is an enlarged plan view of a second cover of a display device according to still another exemplary embodiment of the present disclosure. Only a second cover 1310*b* of a display device of FIG. 13 is different from that of the display device 900 of FIGS. 9 to 11, but the others are the same. Further, a cable hole 1314 is added to the second cover 1310*b* of FIG. 13 as compared with the second cover 1210*b* of FIGS. 12A and 12B, but the others are the same so that a redundant description will be omitted.

Referring to FIG. 13, the second cover 110*b* may include a plurality of variable holes 1213 and a cable hole 1314. The plurality of variable holes 1213 extends in a direction parallel to a rotation axis of the roller 171 and may be configured to be contractible or expandable while winding or unwinding the display unit DP. The cable hole 1314 passes through the plurality of variable holes 1213 and extends in a direction perpendicular to the plurality of variable holes 1213. That is, the cable holes 1314 may extend in a direction perpendicular to the rotation axis of the roller 171. The cable hole 1314 accommodates the flexible cable 950.

The display device according to still another exemplary embodiment of the present disclosure disposes a second cover 1310*b* formed of an elastic resin on a rear surface of the first cover 110*a*. Therefore, even though the external impact is applied to the display device, it is more effectively relieved. Specifically, the second cover 1210*b* includes a plurality of variable holes 1310 which is contractible or expandable. When the second cover 1210*b* is unwound, the second cover has the largest thickness due to the expansion of the plurality of variable holes 1310 and when the second cover is wound, has the smallest thickness due to the contraction of the plurality of variable holes 1213. Therefore, the second cover 1310*b* serves to reinforce the rigidity of the display device during the unwinding and suppress the degradation of the rolling characteristic during the winding.

Specifically, the plurality of variable holes 1213 may extend in a direction parallel to the rotation axis of the roller 171. Therefore, the second cover 1310*b* may be more flexibly deformed when the display unit DP is wound. Therefore, the second cover 1310*b* may easily contract or expand. Further, the impact relieving effect of the second cover 1310*b* is further improved to improve the durability of the display device.

In the display device according to still another exemplary embodiment of the present disclosure, the plurality of flexible cable 930 and the first printed circuit board 940 are disposed in the head bar 182. Therefore, the damage of the plurality of flexible films 930 and the first printed circuit board 940 is suppressed and the reliability of the display device is improved. Further, the flexible cable 950 for connecting the first printed circuit board 940 and the second printed circuit board 160 is accommodated in the cable hole 1314 of the second cover 1310*b*. Accordingly, the flexible cable 950 is more effectively protected and the defect of the display device may be suppressed.

Figure 14:
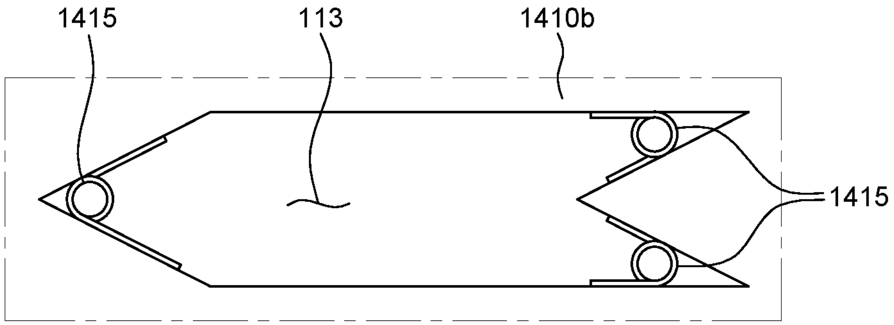
FIG. 14 is an enlarged cross-sectional view of a second cover of a display device according to still another exemplary embodiment of the present disclosure.

FIG. 14 is an enlarged cross-sectional view of a second cover of a display device according to still another exemplary embodiment of the present disclosure. In FIG. 14, only an area corresponding to one variable hole 113 is illustrated. Only a second cover 1410*b* of a display device of FIG. 14 is different from that of the display device 100 of FIGS. 1 to 7, but the others are the same so that a redundant description will be omitted.

Referring to FIG. 14, the second cover 1410*b* may include a plurality of variable holes 113. At this time, a torsion spring 1415 may be disposed in the plurality of variable holes 113. The torsion spring 1415 is a spring whose both ends are elongated. The torsion spring 1415 may be disposed to correspond to a vertex in the variable hole 113 and both sides extending from the vertex. Specifically, an angle between both sides in which the torsion spring 1415 is disposed may be 90° or less, but is not limited thereto. The elasticity of the torsion spring 1415 may allow the variable hole 113 to easily expand.

Specifically, when the variable hole 113 is contracted, both ends of the torsion spring 1415 may be compressed to be close to each other. At this time, the torsion spring 1415 may have elasticity to return to its original state. When the variable hole 113 expands, the torsion spring 1415 returns to its original state due to the elasticity. That is, both ends of the torsion spring 1415 may move away from each other due to elasticity. At this time, the torsion spring 1415 and the inner surface of the variable hole 113 are in contact with each other so that both ends of the torsion spring 1415 move away from each other and the variable hole 113 expands. Accordingly, the variable hole 113 which is contracted may easily return by the torsion spring 1415.

In the meantime, even though in FIG. 14, three torsion springs 1415 are disposed in the variable hole 113, the present disclosure is not limited thereto. Further, even though in FIG. 14, it is described that the torsion spring 1415 is applied to the plurality of variable holes 113 of the display device 100 of FIGS. 1 to 7, but the present disclosure is not limited thereto. That is, the torsion spring 1415 may be applied to the plurality of variable holes 913 of FIGS. 9 to 11B or the plurality of variable holes 1213 of FIGS. 12A and 12B.

Further, the display device according to still another exemplary embodiment of the present disclosure disposes a second cover 1410*b* formed of an elastic resin on a rear surface of the first cover 110*a*. Therefore, even though the external impact is applied to the display device, it is more effectively relieved. Specifically, the second cover 1410*b* includes a plurality of variable holes 113 which is contractible or expandable. When the second cover 1410*b* is unwound, the second cover has the largest thickness due to the expansion of the plurality of variable holes 113 and when the second cover is wound, has the smallest thickness due to the contraction of the plurality of variable holes 113. Therefore, the second cover 1410*b* serves to reinforce the rigidity of the display device during the unwinding and suppress the degradation of the rolling characteristic during the winding.

Specifically, the torsion spring 1415 is disposed in the plurality of variable holes 113. The torsion spring 1415 may be disposed to correspond to a vertex in the variable hole 113 and both sides extending from the vertex. The torsion spring 1415 may allow the plurality of variable holes 113 to easily expand.

Figure 15:
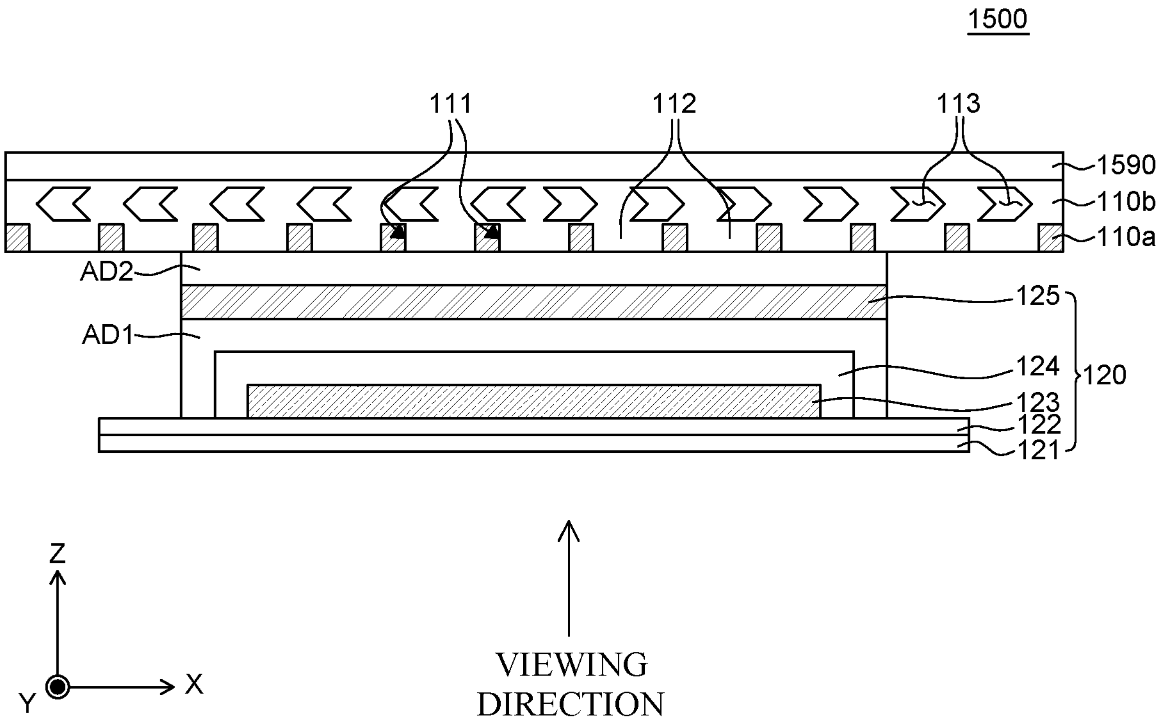
FIG. 15 is a cross-sectional view of a display unit of a display device according to still another exemplary embodiment of the present disclosure.

FIG. 15 is a cross-sectional view of a display unit of a display device according to still another exemplary embodiment of the present disclosure.

The display device 1500 of FIG. 15 further includes an external film 1590, but the others are the same as the display device 100 of FIGS. 1 to 7 so that a redundant description will be omitted.

Referring to FIG. 15, a display device 1500 includes an external film 1590. The external film 1590 is disposed on a rear surface of the second cover 110*b*. The external film 1590 has flexibility to be wound or unwound together with the display panel 120. The external film 1590 may be formed of an opaque polymer material, but is not limited thereto.

In the meantime, when the display device 1500 includes the external film 1590, the second cover 110*b* may be formed of a transparent material. The external film 1590 may suppress the display panel 120 and components disposed on the rear surface of the display panel 120 from being visible through the transparent second cover 110*b*.

The display device 1500 according to still another exemplary embodiment of the present disclosure disposes a second cover 110*b* formed of an elastic resin on a rear surface of the first cover 110*a*. Therefore, even though the external impact is applied to the display device, it is more effectively relieved. Specifically, the second cover 110*b* includes a plurality of variable holes 113 which is contractible or expandable. When the second cover 110*b* is unwound, the second cover has the largest thickness due to the expansion of the plurality of variable holes 113 and when the second cover is wound, has the smallest thickness due to the contraction of the plurality of variable holes 113. Therefore, the second cover 110*b* serves to reinforce the rigidity of the display device during the unwinding and suppress the degradation of the rolling characteristic during the winding.

The external film 1590 is disposed on a rear surface of the second cover 110*b*. At this time, the external film 1590 may be formed of an opaque material. Therefore, when the second cover 110*b* is formed of a transparent material, the components of the display device 1500 may be suppressed to be visible at the side of the rear surface of the display device 1500. By doing this, the appearance quality of the display device 1500 may be improved by the external film 1590.

The exemplary embodiments of the present disclosure can also be described as follows:

According to an aspect of the present disclosure, a display device includes: a display panel including a plurality of pixels; a first cover on a rear surface of the display panel; a second cover on a rear surface of the first cover; and a roller which is configured to wind or unwind the display panel, the first cover, and the second cover, the second cover includes a plurality of variable holes configured to pass through the second cover.

The plurality of variable holes may be configured to be contractible or expandable.

When the second cover is wound to the roller, the plurality of variable holes may be contracted, and when the second cover is unwound from the roller, the plurality of variable holes may expand.

The plurality of variable holes may extend in a direction parallel to one surface of the second cover.

The plurality of variable holes may extend in a direction perpendicular to a rotation axis of the roller.

The plurality of variable holes may extend in a direction parallel to a rotation axis of the roller.

Each of the plurality of variable holes may have a symmetrical shape with respect to an imaginary plane inside the second surface.

One end and the other end of the plurality of variable holes may have vertices corresponding to the imaginary plane.

The display device may further include a torsion spring which is disposed to correspond to at least one of the vertices and both sides extending from the at least one of the vertices in the plurality of variable holes.

The display device may further include: a head bar fixed to an upper end of the first cover; a first printed circuit board in the head bar; a second printed circuit board in the roller; and a flexible cable which connects the first printed circuit board and the second printed circuit board. The second cover may further include a cable hole which accommodates the flexible cable.

The cable hole may extend in a direction perpendicular to a rotation axis of the roller.

The first cover may include a plurality of openings, the plurality of openings may pass through the first cover along a thickness direction of the first cover, and the plurality of variable holes may pass through the second cover in a direction perpendicular to a thickness direction of the second cover.

The second cover may include a plurality of protrusions inserted into the plurality of openings.

The first cover and the second cover may be configured by different materials.

The first cover may include a metal, and the second cover may include a resin.

The display device may further include an external film on a rear surface of the second cover. The second cover may be made of a transparent resin.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising: a display panel including a plurality of pixels; a first cover on a rear surface of the display panel; a second cover on a rear surface of the first cover; and a roller which is configured to wind or unwind the display panel, the first cover, and the second cover, wherein the second cover includes a plurality of variable holes configured to pass through the second cover; and each of the plurality of variable holes has a symmetrical shape with respect to an imaginary plane inside the second surface; and one end and another end of the plurality of variable holes have vertices corresponding to the imaginary plane; and a torsion spring which is disposed to correspond to at least one of the vertices, both sides of the torsion spring extending from the at least one of the vertices in the plurality of variable holes.

2. The display device according to claim 1, wherein the plurality of variable holes is configured to be contractible or expandable.

3. The display device according to claim 2, wherein when the second cover is wound to the roller, the plurality of variable holes is contracted, and wherein when the second cover is unwound from the roller, the plurality of variable holes expands.

4. The display device according to claim 1, wherein the plurality of variable holes extends in a direction parallel to one surface of the second cover.

5. The display device according to claim 1, wherein the plurality of variable holes extends in a direction perpendicular to a rotation axis of the roller.

6. The display device according to claim 1, wherein the plurality of variable holes extends in a direction parallel to a rotation axis of the roller.

7. The display device according to claim 1, further comprising:

a head bar fixed to an upper end of the first cover;

a first printed circuit board in the head bar;

a second printed circuit board in the roller; and a flexible cable which connects the first printed circuit board and the second printed circuit board, wherein the second cover further includes a cable hole which accommodates the flexible cable.

8. The display device according to claim 7, wherein the cable hole extends in a direction perpendicular to a rotation axis of the roller.

9. The display device according to claim 1, wherein the first cover includes a plurality of openings, the plurality of openings configured to pass through the first cover along a thickness direction of the first cover, and the plurality of variable holes configured to pass through the second cover in a direction perpendicular to a thickness direction of the second cover.

10. The display device according to claim 9, wherein the second cover includes a plurality of protrusions inserted into the plurality of openings.

11. The display device according to claim 1, wherein the first cover and the second cover comprises different materials.

12. The display device according to claim 11, wherein the first cover includes a metal, and the second cover includes a resin.

13. The display device according to claim 1, further comprising:

an external film on a rear surface of the second cover, wherein the second cover comprises a transparent resin.

* * * * *